(12) United States Patent
Robinson et al.

(10) Patent No.: US 8,002,578 B2
(45) Date of Patent: Aug. 23, 2011

(54) WATTHOUR METER SOCKET LOCK ADAPTER

(75) Inventors: Darrell Robinson, Waterford, MI (US); Allen Pruehs, Howell, MI (US)

(73) Assignee: Ekstrom Industries, Inc., Farmington Hills, MI (US)

( * ) Notice: Subject to any disclaimer, the term of this patent is extended or adjusted under 35 U.S.C. 154(b) by 0 days.

(21) Appl. No.: 12/427,057

(22) Filed: Apr. 21, 2009

(65) Prior Publication Data
US 2010/0267277 A1  Oct. 21, 2010

(51) Int. Cl.
*H01R 33/945* (2006.01)
(52) U.S. Cl. .................. 439/517; 439/146; 439/508
(58) Field of Classification Search .............. 439/517, 439/508, 146; 361/669
See application file for complete search history.

(56) References Cited

U.S. PATENT DOCUMENTS

| | | | | |
|---|---|---|---|---|
| 2,162,548 | A * | 6/1939 | Campbell | 324/110 |
| 2,367,433 | A * | 1/1945 | Road | 324/156 |
| 4,823,572 | A * | 4/1989 | Signorelli | 70/163 |
| 5,207,595 | A |  5/1993 | Learmont et al. | |
| 5,571,031 | A * | 11/1996 | Robinson et al. | 439/517 |
| 5,577,933 | A | 11/1996 | Robinson et al. | |
| 5,595,506 | A * | 1/1997 | Robinson et al. | 439/638 |
| 5,704,804 | A * | 1/1998 | Robinson et al. | 439/517 |
| 5,851,038 | A | 12/1998 | Robinson et al. | |
| 5,853,300 | A | 12/1998 | Robinson et al. | |
| 6,059,605 | A |  5/2000 | Robinson et al. | |
| 6,200,158 | B1 * | 3/2001 | Robinson | 439/517 |
| 6,325,666 | B1 | 12/2001 | Robinson et al. | |
| 6,488,535 | B1 * | 12/2002 | Robinson et al. | 439/517 |

OTHER PUBLICATIONS

A to S Socket-Type Adapters , 12 catalog pages, 1997-2001.

* cited by examiner

*Primary Examiner* — Hae Moon Hyeon
(74) *Attorney, Agent, or Firm* — Young Basile

(57) ABSTRACT

A watthour meter socket adapter has housing formed of snap together rear and front housings. The front housing surrounds but allows access to jaw contacts and terminals mounted in the rear housing by a watthour meter and electric power conductors. An aperture in the front housing engages a socket adapter mounting fastener extendible through the aperture to attach the socket adapter to a mounting surface. The fastener and aperture resist separation of the front housing from the rear housing when a watthour meter is removed from the socket adapter. A clip extends from the front housing through an aperture in a terminal cover attachable to the front housing and receives a seal lock member. Another clip on the front housing extends through the terminal cover and is engaged by an expandable ring lock clip. A meter surge guard is removably mountable to the rear housing and exteriorly of the front housing.

40 Claims, 25 Drawing Sheets

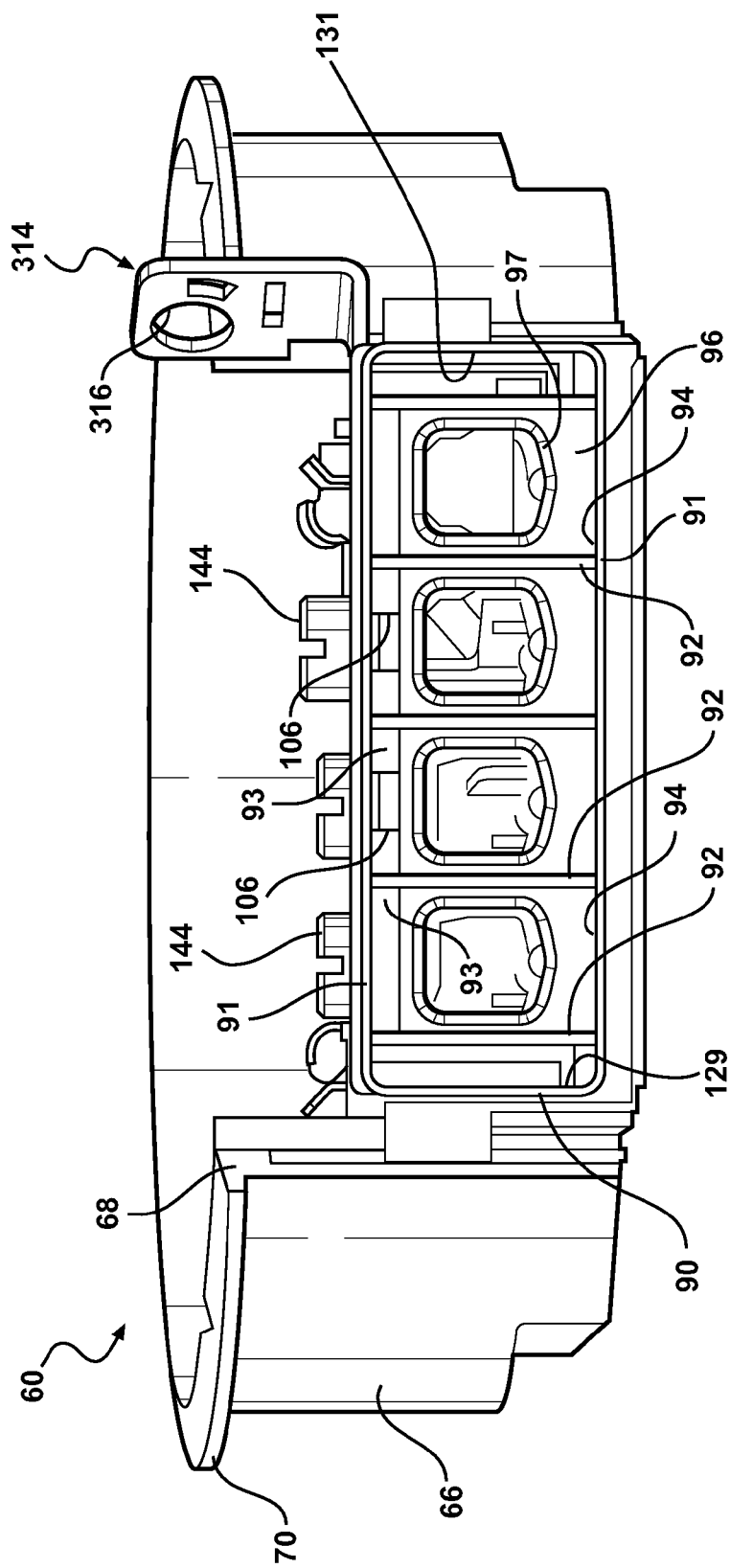

WATTHOUR METER SOCKET LOCK ADAPTER

BACKGROUND

This disclosure relates, in general, to electrical watthour meters and, more specifically, to watthour meter socket adapters.

In the electric utility industry, plug-in, socket-type watthour meters are commonly employed to measure electrical power consumption at a residential or commercial building establishment. A cabinet is typically mounted on an outside wall of the residence or building and contains a meter socket having pairs of line and load contacts which are connected to electric power line conductors extending from the utility power network and electric load conductors connected to the residential or building establishment power distribution network. The contacts receive blade terminals on a plug-in watthour meter to complete an electric circuit through the meter between the line and load terminals mounted in the cabinet for the measurement of electrical power consumption.

S-type, socket-type, plug-in watthour meters have replaced older A base bottom connected meters which were formed of a single piece housing in which the watthour meter was fixedly mounted along with compression terminals which provide connection to the utility power lines and the building load distribution network.

In an installation involving an A-type bottom connected meter, an A to S socket adapter is used to allow a new S-type watthour meter to be installed. The socket type meter has outwardly extending blade terminals which are insertable into the jaw contacts in the cabinet of a S-type meter socket. The socket adapter includes its own set of female jaw contacts which receive the male blade terminals of the S-type plug-in, socket-type meter.

A socket extender adapter used to convert a ringless style socket to a ring-type socket has a similar arrangement of contacts and terminals to plug-in to a socket and to receive an S-type, plug-in, socket-type meter.

While it is typical for a watthour meter, once it is installed in a socket or socket and socket adapter, to remain in service for many years, it is still necessary for such meters to be removed for repair or replacement from time to time as well as to temporarily disconnect electrical service to a particular customer. During the installation and removal of the watthour meter from the socket or socket adapter, the electric power line terminals in the socket or socket adapter remain connected to the electric utility power line conductors and carry potential. The utility employee installing or removing the watthour meter may inadvertently touch such contacts thereby raising the possibility of injury. Furthermore, an inadvertent short across the contacts caused by a tool contacting the contacts or a full fault caused by a 90.degree offset insertion of the meter can cause a spark or flash which could damage the watthour meter installation as well as posing a significant risk of injury to the utility employee.

Various flash covers or shields have been devised as separate attachments to cover a portion of the jaw contacts in a watthour meter socket or socket adapter. The latest flash covers or shields have been designed for simplified installation through a snap-on connection with the socket adapter base or housing.

However, there is a tendency for such flash covers or shields to separate from the socket adapter base or housing when a watthour meter is pulled upward during separation from the socket adapter.

In A to S socket adapters and ring style socket adapter extenders, two mating mounting flanges on the outer portion of the socket adapter housing and the watthour meter base are locked together by a ring lock clip or sealing ring.

One type of a ring lock clip or sealing ring has housings attached to opposite free ends of an annular band. A threaded screw is captively mounted in a housing and is threadingly engageable with the opposite housing to tighten or loosen the annular ring about the mating mounting flanges to lock the two mounting flanges together. Apertures or slots formed in the fastener, and/or the housings of the annular ring receive a wire seal or plastic pad lock after the ring lock clip has been mounted about the mating mounting flanges of a watthour meter and meter socket cover or about a watthour meter and the socket adapter extender.

A to S socket adapters also include a removable cover which is mountable over the terminals in a bottom portion of the socket adapter. A metal clip is typically mounted in the socket adapter base or front housing and is insertable through a slot in the cover to receive a wire seal or plastic pad lock to provide anti-tampering indications for the cover. The cover itself typically snaps into the socket adapter base or front housing.

Electrical overvoltage surge protection is typically provided in such socket adapters or socket adapter extenders by means of a surge guard mounted in the socket adapter housing and connected through a mounting bolt to the socket adapter hanger. Portions of the surge guard extend into the socket adapter mounting flange or rim so as to engage a ground tab on the watthour meter base to electrically ground the watthour meter base through the surge guard to the socket adapter hanger and the surrounding socket mounting surface or closure.

SUMMARY

There is disclosed a watthour meter socket adapter for use with a watthour meter having a plurality of blade terminals extending from a meter base and a peripheral mounting flange. The watthour meter socket adapter includes a rear housing having a base adapted to receive a watthour meter and terminals connectable to electric line and load power conductor. Contacts are disposed in the base and adapted to be connected to the terminals and to receive watthour meter blade terminals. A front housing is attachable to the base and covers the contacts and the terminals while allowing the watthour meter blade terminals to be inserted into the contacts and allowing access to the terminals through the front housing.

In one aspect, an aperture in the front housing receives a fastener having a head. The head of the fastener engages the front housing when the fastener extends through the front housing into a socket adapter mounting surface to resist separation of the front housing from the rear housing.

In one aspect, the aperture may be at least one open ended slot. One or more hooks may be positioned on the front housing adjacent to the slot to capture the head of the fastener.

In another aspect, at least one hook member carried on one of the front housing and the rear housing engages with at least one hook receiving surface carried on the other of the front housing and the rear housing. The at least one hook receiving surface may include an aperture in the rear housing intermediate opposed lateral sides of the rear housing. The at least one hook member is carried on front housing and is slidingly engageable with the aperture of the rear housing when the front housing and rear housing are joined.

In another aspect, a terminal cover is mountable over terminals in the rear housing and attachable to the housing. A clip is integrally formed on the front housing and extends through an aperture in the terminal cover when the terminal cover is mounted on the joined front and rear housings. The clip is adapted for receiving a terminal cover seal.

In another aspect, a hanger is adapted to be engaged with a socket adapter mounting surface. A housing hanger fastener extends into engagement with the hanger through the rear housing. A surge conductor is removably mountable in the rear housing by the hanger fastener.

The surge conductor may include a unitary, electrically conductive body including a boss with a bore adapted to receive the hanger fastener, a pair of arms extending from the boss, end pieces extending from outer portions of the arms and transitioning into legs mountable adjacent an inner surface of the rear housing. A tab is carried on the end of the each leg adapted to be mounted in a position adapted to engage a ground contract on a watthour meter inserted into the joined front and rear housings.

The surge conductor is removably securable to the hanger fastener when used with a front housing, the surge conductor is securable to the hanger fastener exteriorly of the front housing to permit the surge conductor to be removed from the front housing without first separating the front housing from the rear housing.

In another aspect, a terminal cover is mountable over the terminals and attachable to the rear housing. The terminal cover has a wall extending from an upper end, the wall and the upper end defining a cavity adjacent to the terminals. The terminal cover substantially encloses all exterior portions of the terminals.

In another aspect, a ring lock clip has a band and a lock clip carried on the band releasably locking the band about a watthour and a sidewall of the rear housing. A projection is carried on and extends from one of the rear housing and the front housing. The projection is engageable with the lock clip when the lock clip locks the band about the socket adapter housing and a watthour meter.

In another aspect, a watthour meter socket adapter includes a housing having a base adapted to receive a watthour meter. Contacts are disposed in the base adapted to receive watthour meter blade terminals. At least one open-ended attachment aperture is formed in the housing adapted to engage a fastener mountable on a socket adapter mounting surface. The housing is mountable over the fastener after the fastener is mounted in the mounting surface. The attachment aperture may be an open-ended slot. At least one hook member may be carried on the housing which is engageable with the fastener to resist movement of the housing relative to the mounting surface.

BRIEF DESCRIPTION OF THE DRAWING

The various features, advantages and other uses of the present watthour meter socket lock adapter will become more apparent by referring to the following detailed description and drawing in which:

FIG. 6 is a bottom elevational view of the socket adapter shown in FIG. 5A;

DETAILED DESCRIPTION

Figure 1:
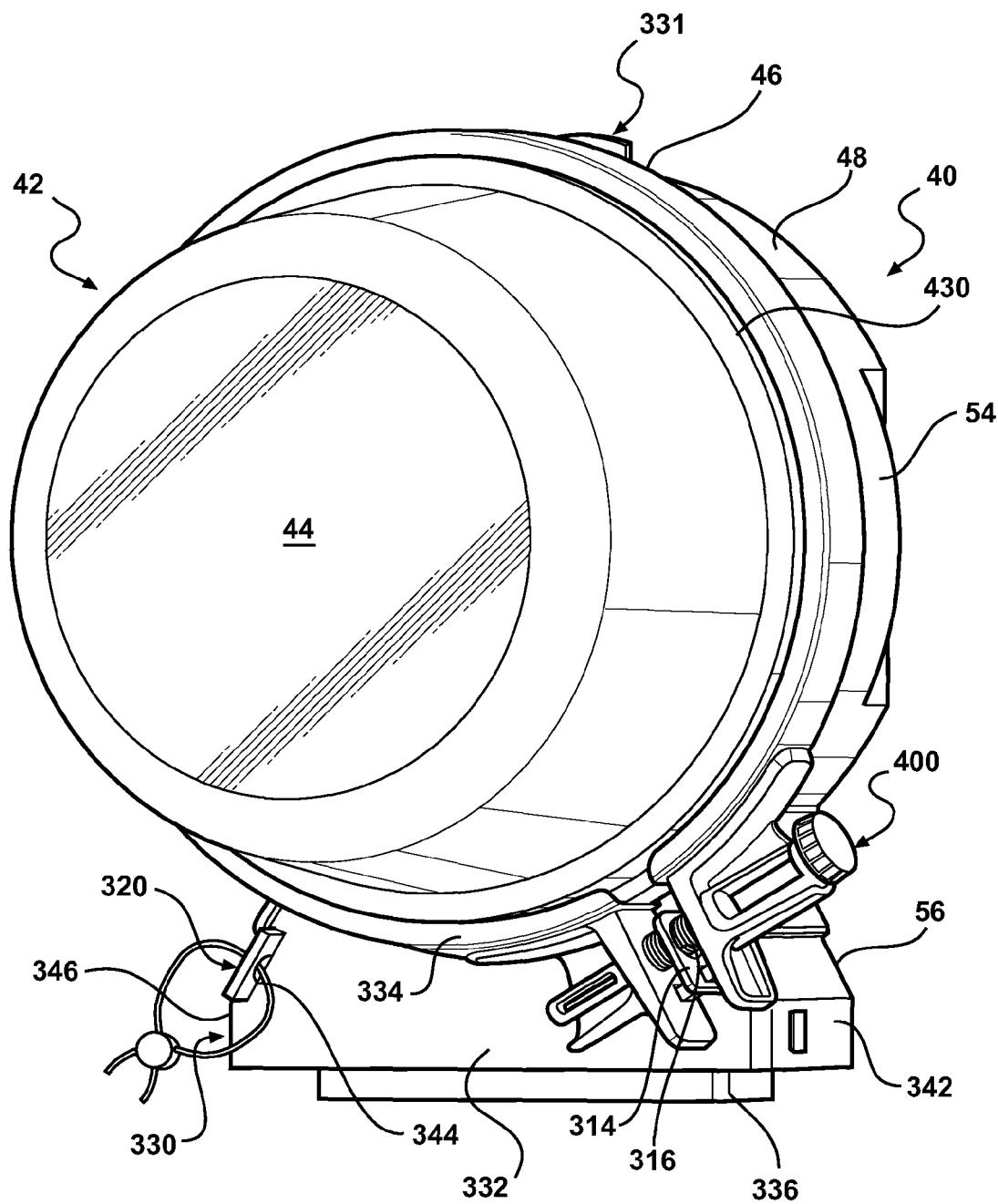
FIG. 1 is a front perspective view of one aspect of a watthour meter socket adapter.

In the following description front, back, top, bottom, left, side, right side, inner or inward, and outer or outward have their normal meanings and apply to the normal mounting orientation of a watthour meter socket adapter in a meter socket or in a watthour meter socket enclosure, both of which typically have a vertical mounting surface for a watthour meter.

Referring now to the drawing, there is depicted an electrical watthour meter mounting apparatus, such as a socket or socket adapter, having a front insulating housing or cover which resists separation from the rear housing when a watthour meter is disengaged from the adapter jaw contacts, a replaceable meter surge guard, a ring lock clip, a terminal cover, lock ring clip, sealing feature, a front housing with an integral terminal cover mounting clip, and an alternate enlarged, European-style, terminal portion and terminal cover.

The following description of a bottom connected type watthour meter socket adapter 40 is provided by way of example only. As shown in FIG. 1, a single phase socket and bottom connected meter to socket meter adapter 40 receives a conventional, socket-type watthour meter 42 is a push-in, snap-in connection. As is well known, the socket-type watthour meter 42 includes a dome or cover 44 which encloses the internal mechanism and gages or display of the watthour meter 42. An annular mounting flange 46 extends radially outward from a base 48 of the watthour meter 42 and provides a mounting connection to the socket adapter 40, as described hereafter. A plurality of blade terminals are provided in a predetermined number and arrangement depending upon the type of electrical service provided to a customer, i.e., single phase, three phases, etc. The blade terminals extend outward from the base 48 of the watthour meter 42 and respectively engage jaw contacts in the socket adapter 40, as described hereafter.

The socket adapter 40, by way of example only, is depicted as a bottom type socket adapter having a watthour meter receiving portion denoted generally by reference number 54 and an adjacent terminal portion 56. The watthour meter receiving portion 54 surrounds the jaw contacts which receive the blade terminals of the watthour meter 42. The terminal portion 56, as described in greater detail hereafter, provides terminal connection to the electric utility company line conductors and the building or residence load distribution network.

As shown in FIGS. 3-15, the socket adapter 40 is formed of a two part housing consisting of a first or rear housing 60 and a second or front housing 62. The rear and front housings 60 and 62 are formed of an electrically insulating material, such as a suitable plastic.

The first or rear housing 60 includes a planar base or plate 64 having an annular side wall 66 extending outward from one surface thereof. The annular side wall 66 has a discontinuity 68 formed at a predetermined portion which extends over a predetermined angular extent of the side wall 66 adjacent to the terminal portion 56 of the socket adapter 40. The side wall 66 terminates in an radially extending, annular flange or mounting rim 70.

Figure 5A:
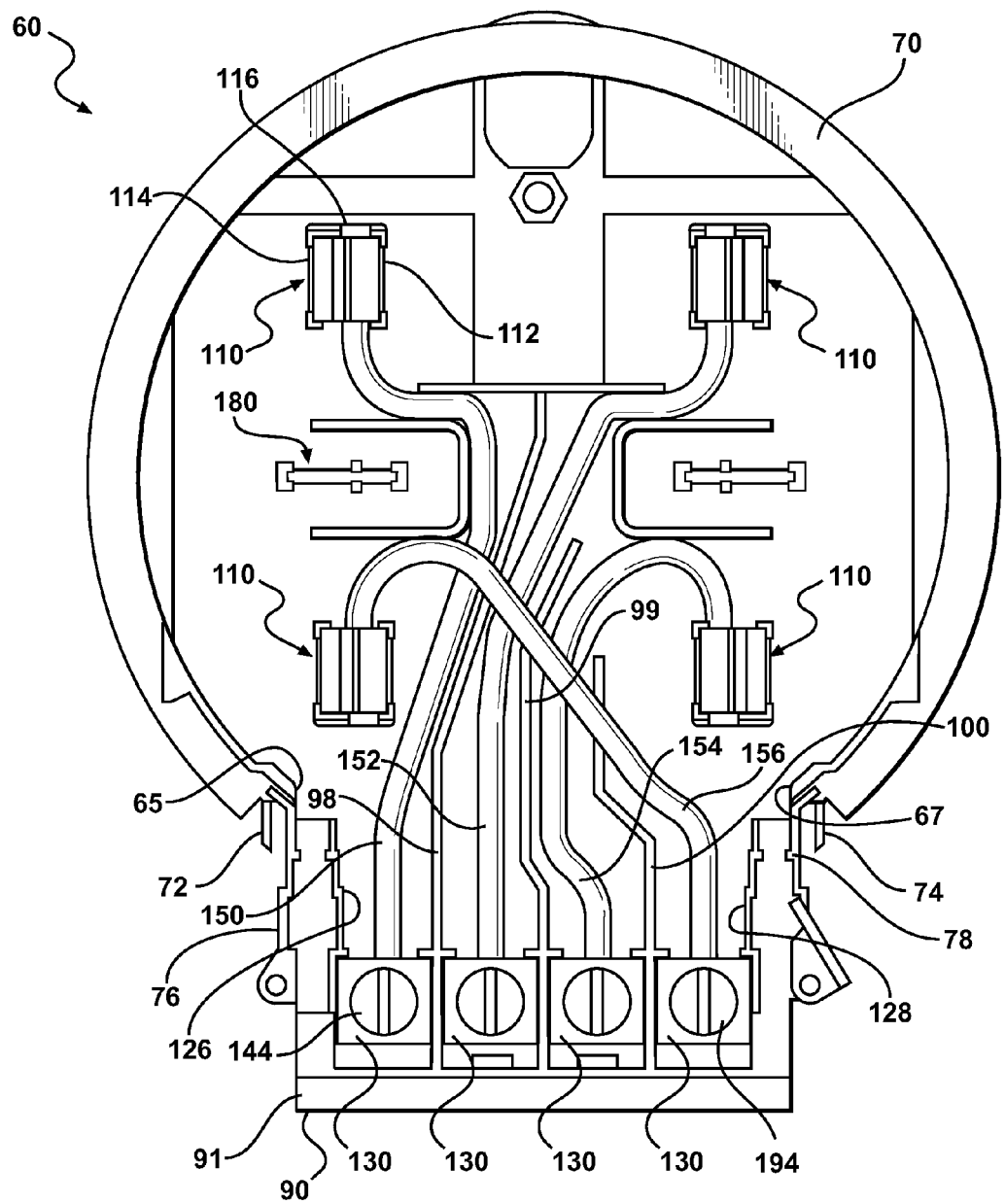
FIG. 5A is a front elevational view of the socket adapter shown in FIG. 4.
Figure 5B:
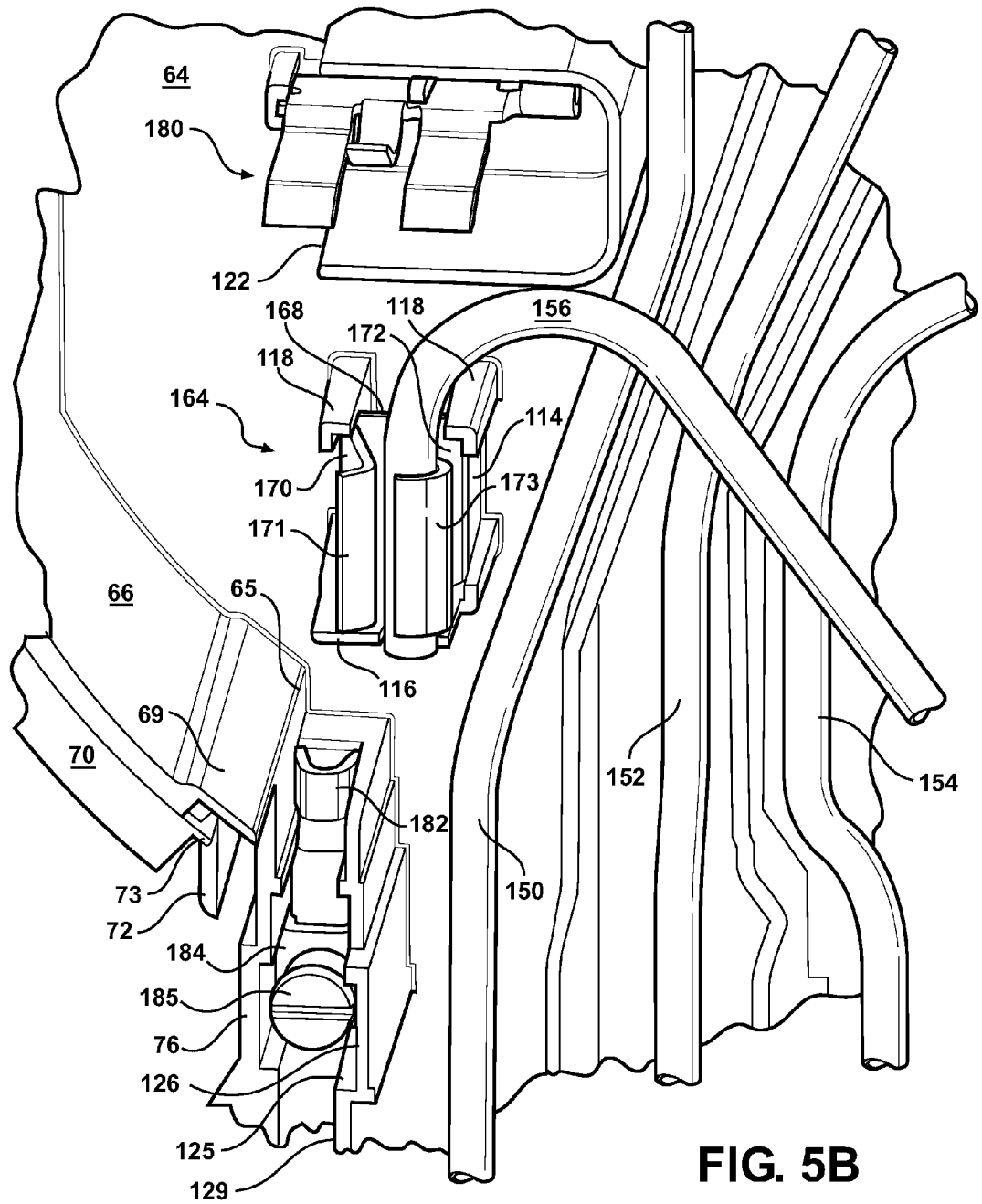
FIG. 5B is and enlarged, partial, perspective view of the socket adapter shown in FIG. 5A.

The discontinuity 68 in the sidewall 66 is formed between a pair of spaced sidewall ends 65 and 67 which are carried on flanges 69 and 71, respectively, projecting out of the annular extent of the sidewall 66 as shown in detail in FIG. 5B. The flanges 69 and 71 are spaced from shorter length lips 73 and 75, respectively, to define a slot 77 between each pair of flanges and lips 69 and 73, and 71 and 75.

A pair of spaced, flanges 72 and 74 are formed on opposite sides of the base or plate 64 adjacent to planar side wall extensions 76 and 78, respectively, which project from the spaced ends of the side wall 66. The flanges 72 and 74 have an outer end spaced from the respective side wall extensions 76 and 78 to define a slot for mating engagement with a corresponding surface on the front housing 62, as described hereafter, when the front and rear housings 62 and 60 are joined together.

The general parallel side wall extensions 76 and 78 terminate in a bottom edge 90 shown in FIGS. 5A and 6 which defines part of a peripheral edge about the terminal portion 56 of the socket adapter 40. The bottom edge 90 is subdivided internally by a plurality of walls 92 which extend between walls 91 which are laterally spaced across the terminal portion 56. The walls 91 and 92 and the intervening portions of the bottom edge 90 define cavities 94 which extend from the peripheral edge 90 to an opposed wall 96 shown in FIG. 3. The cavities 94 extend through the wall 96 to provide access to terminals mounted within the terminal portion 56 of the socket adapter housing as described hereafter.

Figure 3:
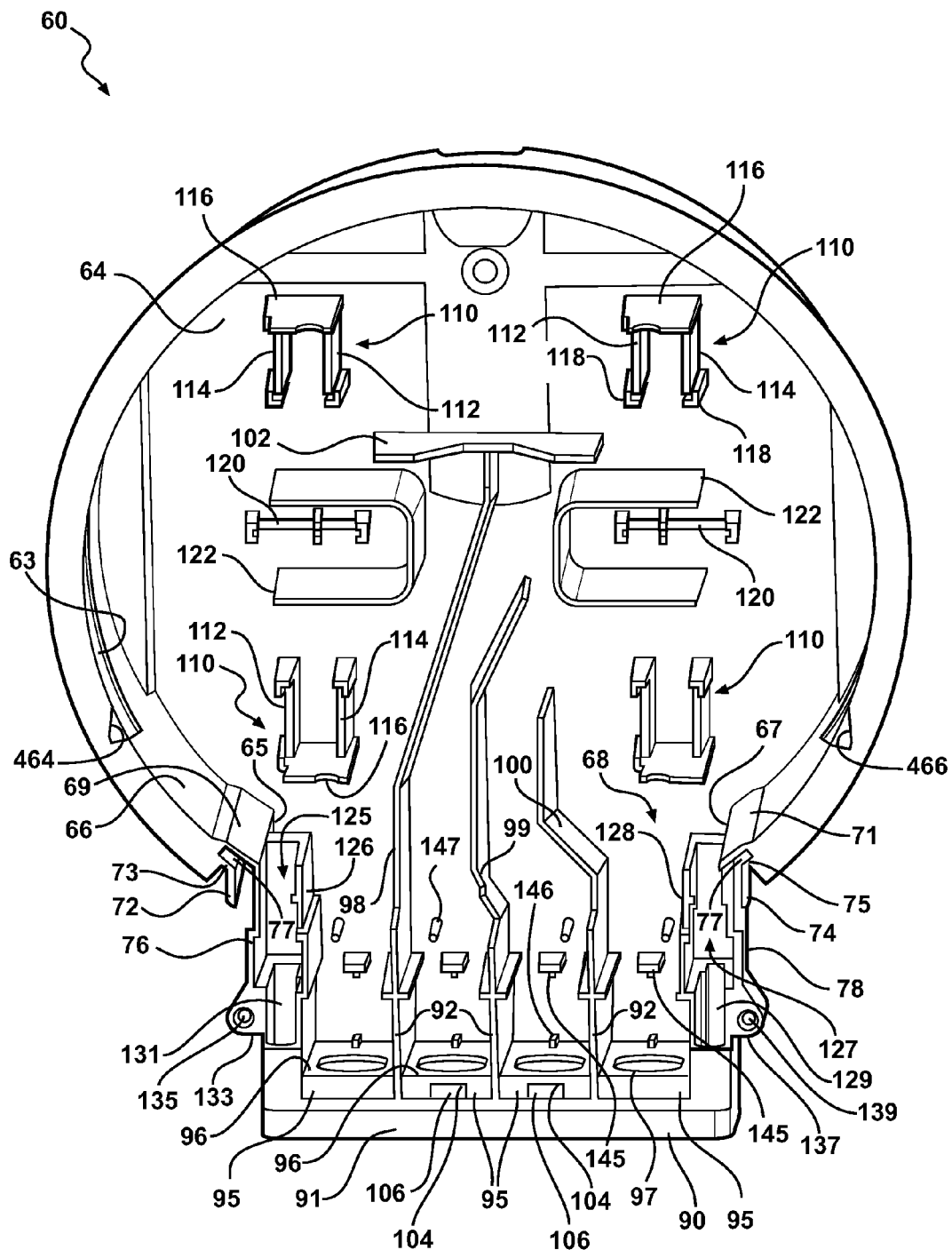
FIG. 3 is a perspective view of the base of the socket adapter shown in FIG. 1, with the socket adapter front cover, terminals, conductors, and terminal cover removed.

As shown in FIG. 3, the walls 92 within the bottom edge 90 are aligned with a plurality of barriers, with three barriers 98, 99 and 100 shown by example only, which extends from the walls 96 through the terminal portion 56 and through a portion of the watthour meter receiving portion 54. By example only, the barrier 98 terminates in a laterally extending barrier wall 102.

An aperture 97 is formed in each wall 96 to allow access through the cavity 94 and the aperture 97 to terminals mounted within the terminal portion 56 of the rear housing 60, as described hereafter.

As depicted in FIG. 6, chamfers 93 are formed along one edge of each cavity 94 to act as a wire guide as electrical conductors are inserted through into the cavities 94.

A similar chamfer 95 is formed on the opposite side of the wall 96. To of the interior located chamfers 95 contain an aperture 104, FIG. 4, which extends through the chamfers 93 to form a pair of through bores denoted by reference number 106, the purpose of which with be described hereafter.

Figure 4:
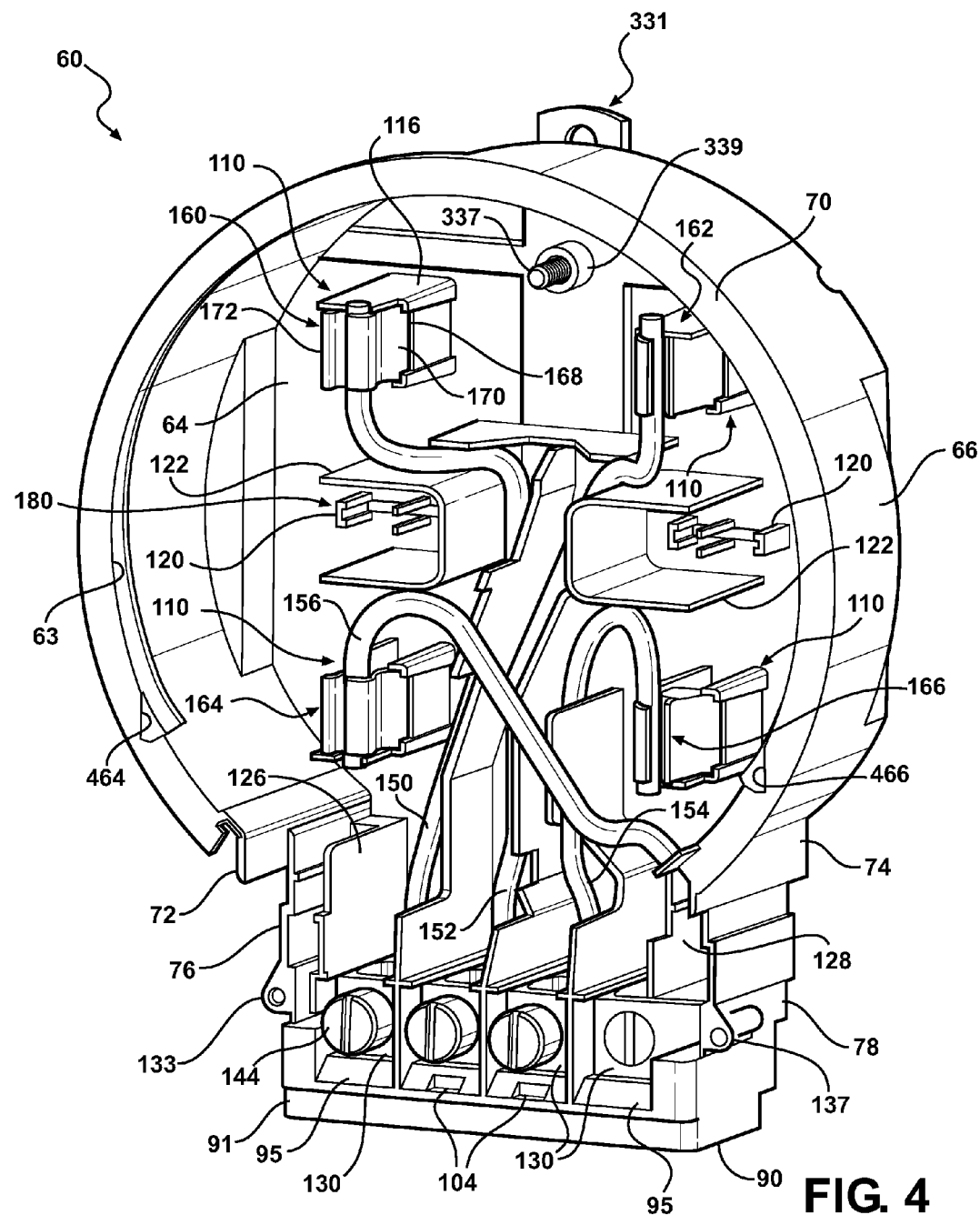
FIG. 4 is a perspective view of the socket adapter base, jaw contacts, conductors, and terminals.

A plurality of jaw contact mounting structures 110, with four jaw contact mounting structures 110 shown by way of example only in FIGS. 3-5 for single phase electrical service, are mounted or integrally formed on the plate 64 in the watthour meter receiving portion 54 of the rear housing 60. The jaw contact mounting structures 110 are substantially identical and include a pair of spaced, generally parallel sidewalls 112 and 114 which are joined at one end by an end wall 116 to define a U-shaped structure having an opening at the ends of the sidewalls 112 and 114 opposite the end wall 116. Further, the outer edges of the sidewalls 112 and 114 away from the back plate 64 are recessed below the outer edge of the end wall 116 as well as the outer edge of a pair of opposed posts 118 disposed at the ends of the sidewalls 112 and 114 opposite from the end wall 116.

A pair of bosses 120 is also formed on the base or plate 64. The bosses 120 are configured for mounting a potential contact within the watthour meter receiving portion 54 as described hereafter. U-shaped insulating walls 122 are mounted on or integrally formed with the base or plate 64 and surround at least a portion of the potential contact mounting bosses 120.

Figure 23:
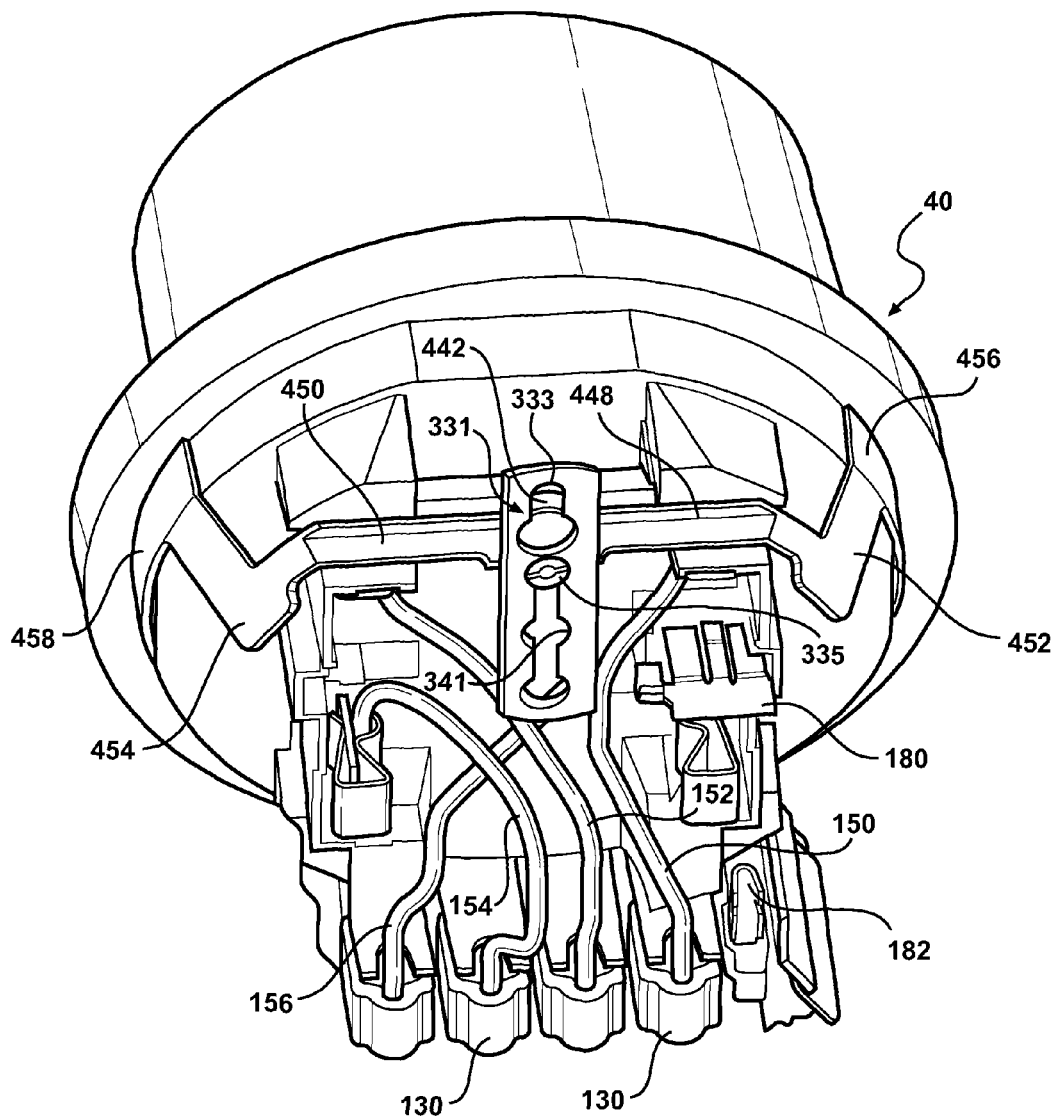
FIG. 23 is a rear perspective view showing the attachment of the socket adapter hanger, the socket adapter hanger mounting bolt and the meter surge guard conductor, with a portion of the socket adapter rear housing base removed.

A pair of interior walls 126 and 128 is formed in the terminal portion 56 and extends generally parallel to the side wall extensions 76 and 78, respectively. At least a portion of the extent of the spaced edges of the side wall extensions 76 and 78 and the interior walls 126 and 128, respectively, define receptacles 125 and 127 which are open for receiving a potential terminal as described hereafter. End portions of the receptacles 125 and 127 formed by the side wall extensions 76 and 78 and the interior walls 126 and 128, respectively, open to cavities 129 and 131, see FIG. 6, within the peripheral edge 90 of the terminal portion 56 for connection to external conductors, not shown. By way of example only, one meter potential jaw contact 180 and one potential terminal 182 are shown in FIG. 23.

A plurality of current terminals 130, with four terminals 130 shown by way of example only in FIGS. 5A 5B, 5C and 5D for the illustrated single phase electrical power service, are mounted in the cavities 94 in the terminal portion 56. Each terminal 130 is formed as a cubical body with four sidewalls 132, 134, 136 and 138. Side wall 138 has a semi-circular shaped recess 140, See FIG. 7, opening to the interior of the terminal body 130 for receiving one end of an electrical conductor as described hereafter. A threaded aperture 142 is formed in the side wall 134 for receiving a threaded fastener or a screw 144.

A through bore 143 extends between opposite side edges of each terminal body 130 and defines an opening for receiving one end of an electrical power line conductor or distribution load conductor. The fastener 144 can be tightened to securely connect the line and load electrical power conductors to the conductors within the rear housing 60.

The terminal bodies 130 are disposed within the terminal portion 56 of the rear housing 60 between walls 92 formed on the base or back plate 64 of the rear housing 60 and/or on the barriers 98, 99 and 100, as well as in the shape of portions of the inner sidewalls 126 and 128 is shown in detail in FIG. 3.

The terminal bodies 130 are oriented within the cavities formed between the inner sidewalls 126 and 128, the barriers 98, 99 and 100 and conductor supports 145 and 146 with through bore 138 aligned with the aperture 97 in the wall 96 in the terminal portion 56 of the rear housing 60. This places the threaded bore 142 and the fastener 144 facing outward from the base or plate 64 as shown in FIG. 4 for easy access to the fasteners 144.

The terminal bodies 130 are formed of an electrically conducted material, such as copper, copper alloy, etc.

As shown in FIG. 3, the conductor supports 145 extend from the back or plate 64 spaced from, but in close proximity to one end of the terminals 130 to support one of the conductors 150, 152, 154, and 156. Each conductor support 145 has a semicircular tip formed at a radius substantially the same as the radius of the conductors 150, 152, 154, and 156. A plurality of posts 147 also extend from the back of plate 64. One post 147 is situated between each barrier 98, 99, and 100 and the adjacent inner sidewalls 126 and 128. The posts 147 act as a guide to insure proper placement of each conductor 150, 152, 154 and 156 between the dividers 98, 99 and 100 and the inner sidewalls 126 and 128.

A plurality of electrical conductors, with four electrical conductors, 152, 154 and 156 being shown by way of example only for the single phase electrical service described in the example of the socket adapter 50, are employed in the socket adapter 40. Each conductor 150, 152, 154 and 156 is formed of an electrically conductive material, such as copper, cooper alloy, aluminum, etc., and by way of example only are formed as a solid tubular member.

Figure 7:
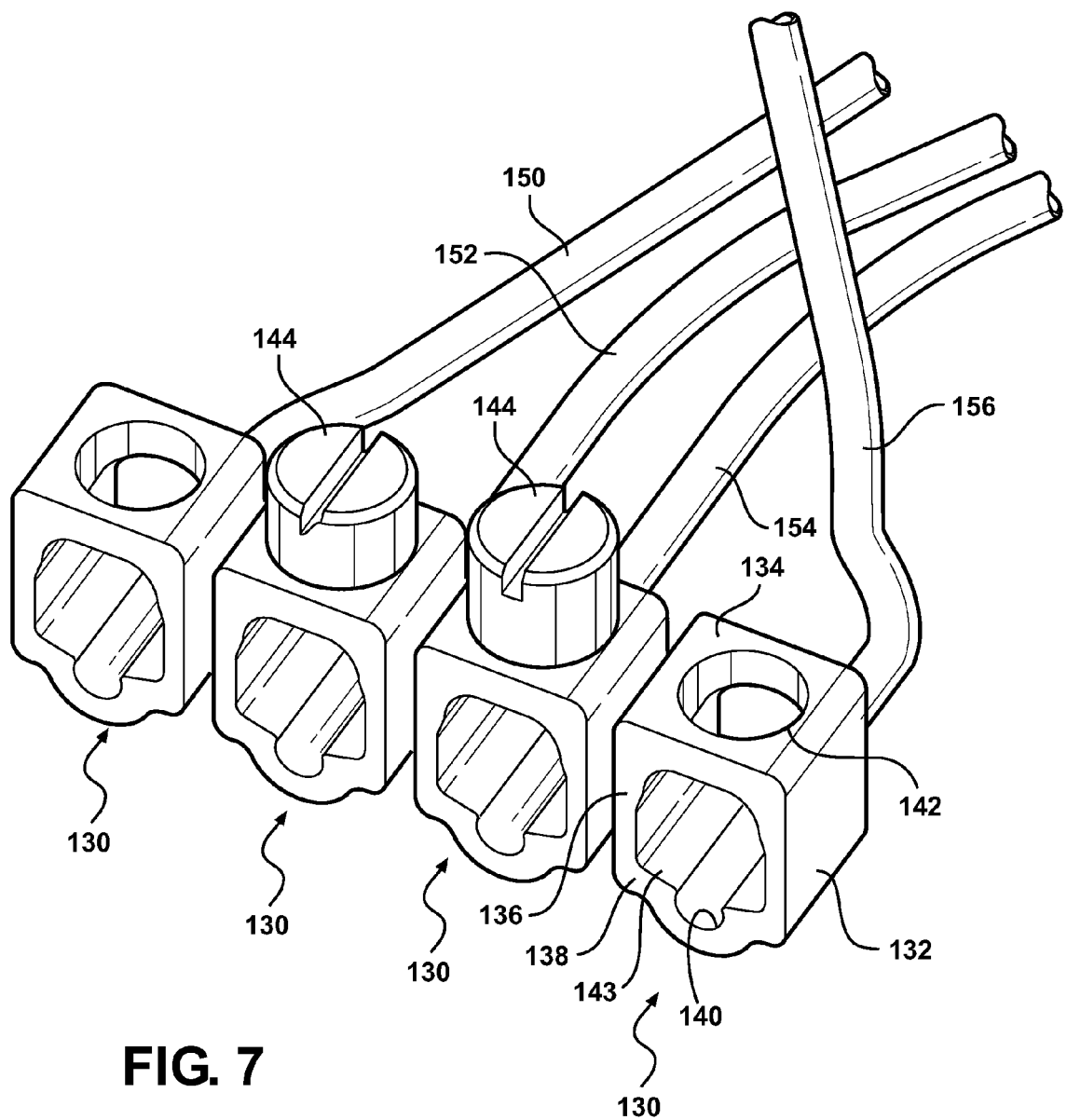
FIG. 7 is a perspective view of the electrical conductors and terminals employed in the socket adapter shown in FIG. 1.

Each conductor 150, 152, 154 and 156 has opposed ends which are connectable to a jaw contact as described hereafter, and engageable with one of the terminals 130 by insertion into the recess 140 in each terminal 130 as shown in FIG. 7. The recess 140 holds one end of each of the conductors 150, 152, 154 and 156 in the terminal body 130 prior to insertion of the electrical power line or load conductors into the terminal body 130 into electrical contact which a portion of the conductors 150, 152, 154 and 156 which are exposed through the open portion of the recess 140.

By way of example, each conductor 150, 152, 154, 156 and 158 has an angular or three dimensional shape so as to be disposed within the watthour meter receiving portion 54 of the socket adapter housing 52 between the terminals 130 and the jaw contacts in a spaced manner between the barriers 98, 99 and 100, the jaw contact mounts 110 and the potential jaw isolating walls 122. It will be understood that other shaped configurations of the conductors 150, 152, 154 and 156, as well as additional conductors may also be employed for other jaw contact and terminal configurations as well as three phase electrical service.

Any current type of jaw contact may be employed in the socket adaptor 40. By way of example only, 160, 162, 164 and 166 are illustrated for the exemplary single phase electrical power service. As each of the contacts 160, 162, 164 and 166 is substantially identical constructing the following description of the jaw contact 160 will be understood to apply equally to the other jaw contacts 162, 164 and 166.

The jaw contact 160 as a general U-shaped configuration formed of a base 168 which seats on the sidewalls 112 and 114 and between an end wall 116 and posts 118. Two legs 170 and 172 project angularly inward from the base 160. The opposite ends of the legs 170 and 172 are formed in an outward angled configuration 171 for the leg 172 to act as a guide for receiving a watthour meter blade terminal and a wrapped over configuration 173 on the end of the leg 172 which snugly receives or is crimped to one end of conductor 156. As shown in detail in FIG. 5B, the wrapped over configuration or end 173 of a jaw contact 164 can be crimped to one end of the conductor 156. This exposes a side end portion of the conductor 156 in the ends 173 between the jaw legs 170 and 172 to enable a watthour meter blade terminal inserted between the ends 171 and 173 of the jaw contact 164 to electrically engage the conductor 156 while being securely held in the jaw contact 164 by the spring tension of the jaw legs 170 and 172.

The jaw contacts 160, 162, 164 and 166 can snap mount or fit snugly into the jaw contact mounting structures 110.

Referring briefly to FIGS. 5A and 5B, each potential jaw contact 180 may have a three figure jaw configuration, for example, with a collar portion which can be crimped about one end of a conductor, not shown, which extends to a similar crimped connection in a potential terminal 182. As shown in FIG. 23, the potential terminal 182 is mounted in a terminal body 184 similar to the terminals 130 by a threaded fastener or screw 185.

Referring now to FIGS. 8A-14, details of the front housing 62 will be described.

The front housing 62 is shown, by way of example, as a one piece body constructed of an electrically insulating material, such as a plastic material. The front housing 62 has a jaw contact surrounding portion 200, an intermediate connecting portion 202, a rim filler 204 and a terminal portion 206.

It will be understood that the front housing 62 may also include additional components as well as being formed of multiple portions which are joined together by adhesive, fasteners, sonic or heat welding, etc.

As shown in FIGS. 8A-11, the jaw contact surrounding portion 200 includes an outer surface or wall 210 (outer is used in the normal mounting orientation of the front housing 62 on the back housing 60 when the socket adapter 40 is mounted on a vertically extending surface). Four sidewalls 212, 214, 216 and 218 extend from the outer surface 210. The sidewalls 214, 216 and 218 have a length from a slightly raised boss end 220 spaced a small amount from the outer face 200 to an opposite end that is sized to substantially surround all of the exposed portions of the jaw contacts 160, 162, 164 and 166. Each raised boss end 220 has a through aperture in the form of a slot 222 extending therethrough. Each slot 222 enables one watthour meter blade terminal to pass therethrough into electrical contact with the underlying jaw contact 160, 162, 164 and 166 and the conductors 150, 152, 154 and 156 mounted therein.

Similar slots 224 are provided in raised bosses 226 between the four slots 222 to enable a watthour meter potential blade terminal to be inserted into contact with one of the potential jaw contacts 180, see FIG. 23.

One or a pair of window-shaped structures, each denoted by reference number 225, are also coupled to or integrally formed with front housing 62 and project laterally outward from the sidewalls 212 and 216 of the jaw contact portion 200. Each window-shaped structure 225 defines a mounting surface for receiving auxiliary components, such as the switch 261 shown in FIG. 11 and described in greater detail hereafter.

A cylindrical collar 230 is mounted in the side wall 214. A bore extending through the collar 220 receives a threaded stud which is used to assist in connecting one end of the front housing 62 to the rear housing 60 as well as to provide a mount for a socket adapter as described herein.

Figure 10:
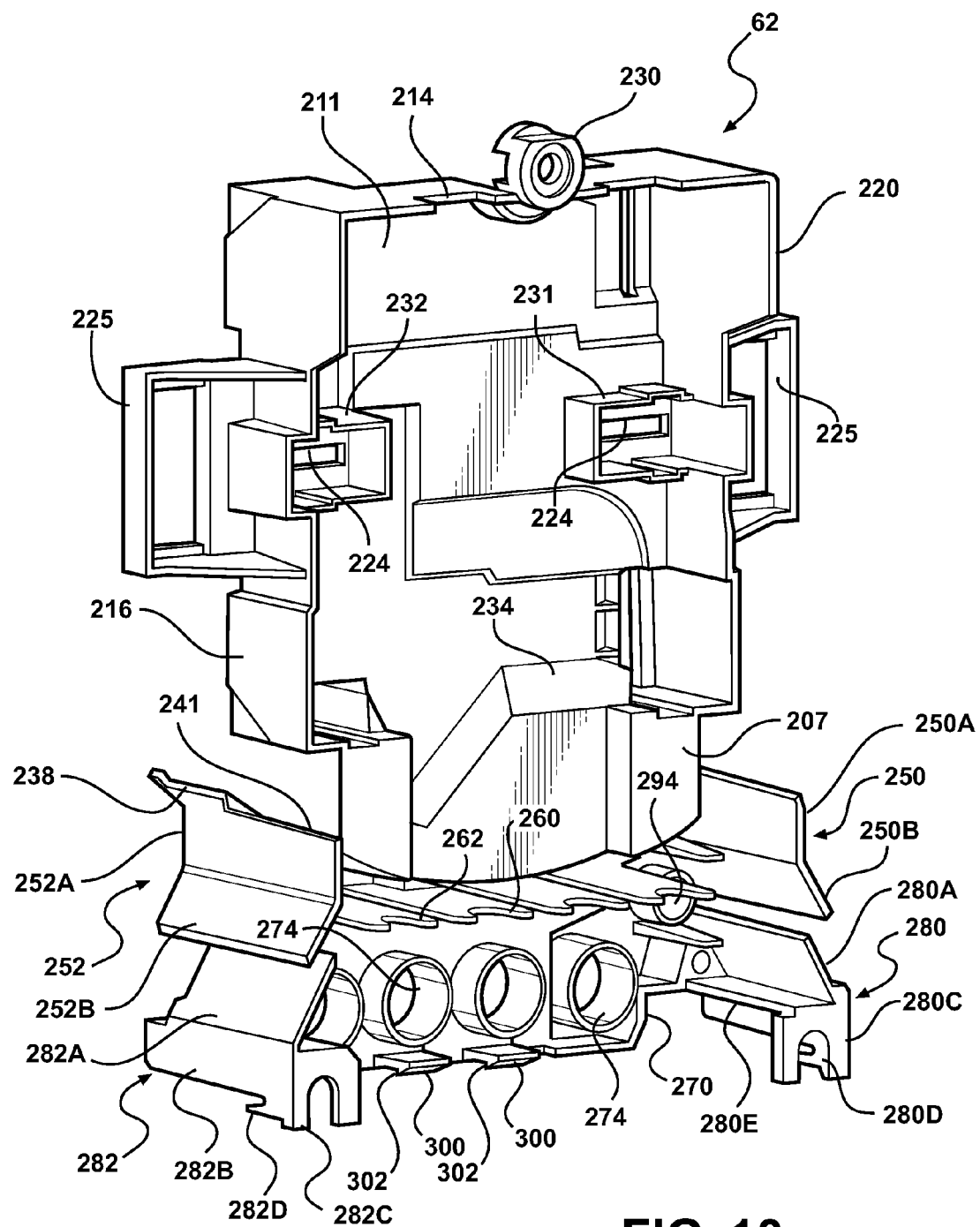
FIG. 10 is a rear perspective view of the socket adapter front cover.

As seen more clearly in FIG. 10, generally U-shaped barriers 231 and 232 extend inward from the outer surface 210 and, in conjunction with the portion of the sidewalls of the boss 226, surround and form a receptacle around the potential blade terminal slots 224.

The receptacles are disposed within the U-shaped barriers 122 on the base or plate 64 to provide an electrically insulating barrier between each potential jaw contact 180 and the surrounding high current carrying jaw contacts 160, 162, 164 and 166.

The intermediate portion 202 has a reduced height from the height of the sidewalls 212, 214, 216 and 218, and extends from an angled surface 234 formed at one end of the outer surface 210 to accommodate the shape and position of the conductor 156 which overlays the other conductors 160, 162 and 166 as shown.

The rim filler 204 is in the form of an arcuate shaped flange with a circumferential extent substantially equal to the extent of the discontinuity 68 in the mounting flange or rim 70 of the rear housing 60. The ends of flanges 238 and 240 project circumferentially outward from opposite ends the rim filler 204 and engage the complementary shaped slots 77 formed in the ends 65 and 67 of the side wall 66 and in mounting flange or rim 70 of the rear housing 60 in a slide in manner when the front housing 62 is slidably inserted into the rear housing 60.

A rim edge 246 projects outward from the rim filler 204 to define a circumferential arch shaped segment which smoothly fills the discontinuity 68 in the side wall 66 of the rear housing 60 and the rim 70 for mounting of a ring lock clip thereover as described hereafter.

A pair of side flange assemblies 250 and 252 depend from the ends 238 and 240 of the rim filler 204 and extend from the outer rim edge 246 rearwards for substantially the full depth of the front housing 62. Each side flange assembly 250 and 252 includes an upper flange 250A and 252A, respectively, and a lower flange 250B and 252B, respectively, which extend laterally outward at an angle from the generally vertically extending upper flange 250A and 252A.

The upper flanges 250A and 252A fit into slots formed between the depending flanges 72 and 74 located at either end of the side wall 66 and the mounting flange or rim 70 of the base plate 64 and one of the adjacent outer sidewalls 76 or 78 to aid in aligning the front housing 62 with the rear housing 60 when the front housing 62 and rear housing 60 are joined in a slide together manner.

Extending from the rear surface 211 of the outer surface 210 of the front housing 62, generally in line with the rim filler 204, are a plurality of outward extending fingers 260, see FIG. 10. One finger 260 is provided for each of the current conductors 150, 152, 154 and 156. The end 262 of each finger 260 has a recess-like shape complementary to the diameter of the conductors 150, 152, 154 and 156 to support each conductor 150, 152, 154 and 156.

Figure 8A:
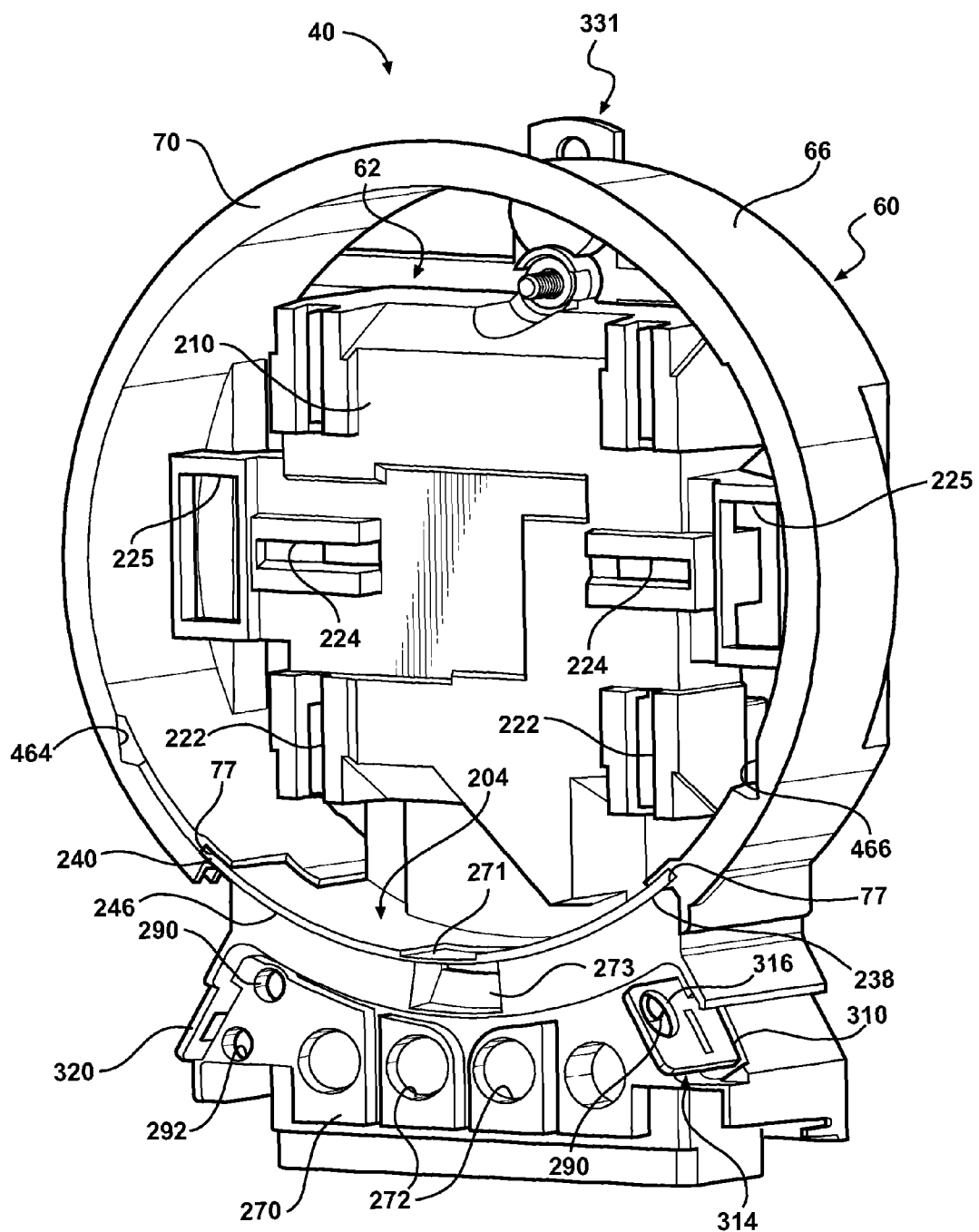
FIG. 8A is a front perspective view of the socket adapter shown in FIG. 1 and depicting the mounting of the front socket adapter housing in the rear socket adapter housing.
Figure 8B:
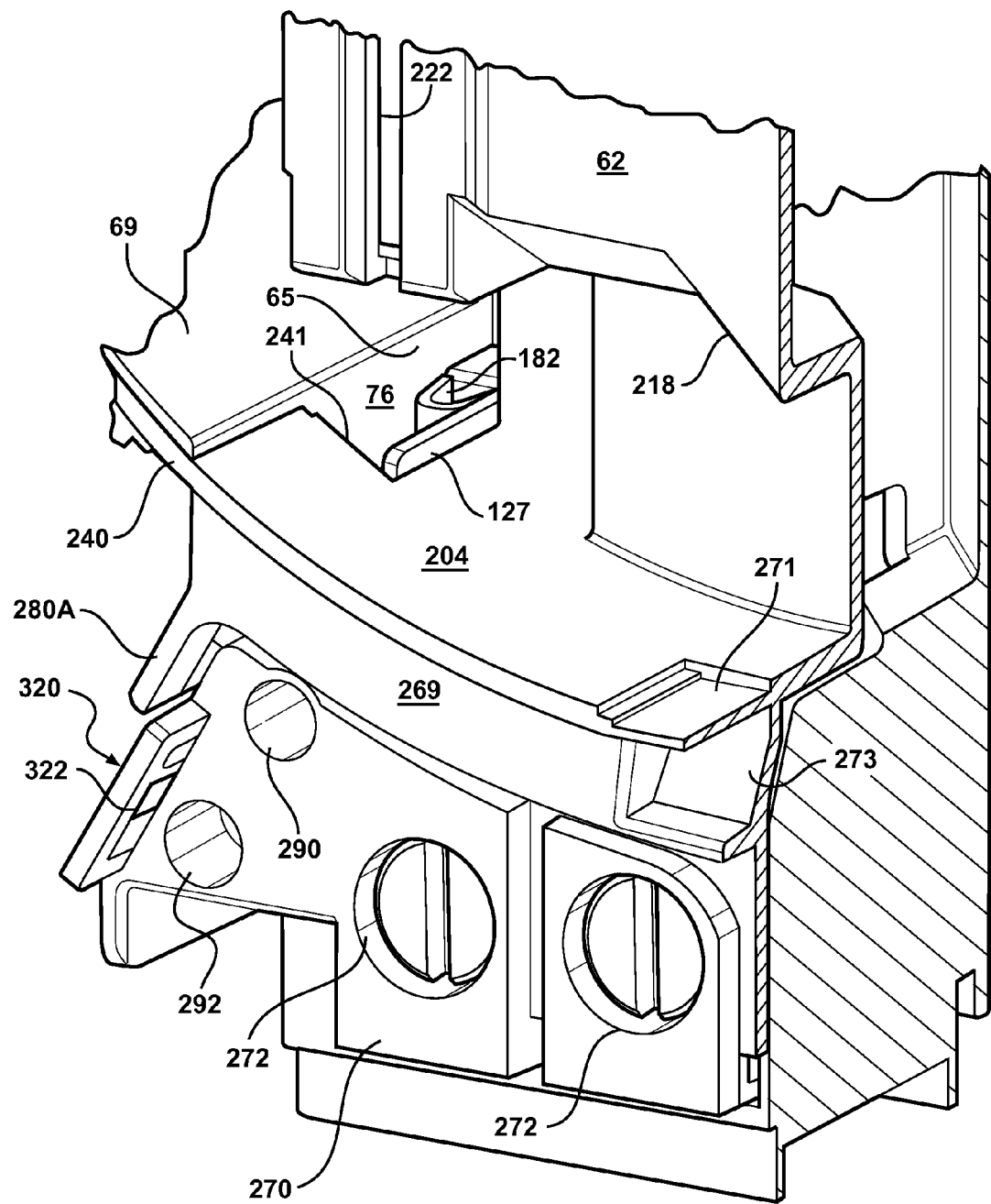
FIG. 8B is an enlarged partial, perspective view of the joined front housing and rear housing.
Figure 9:
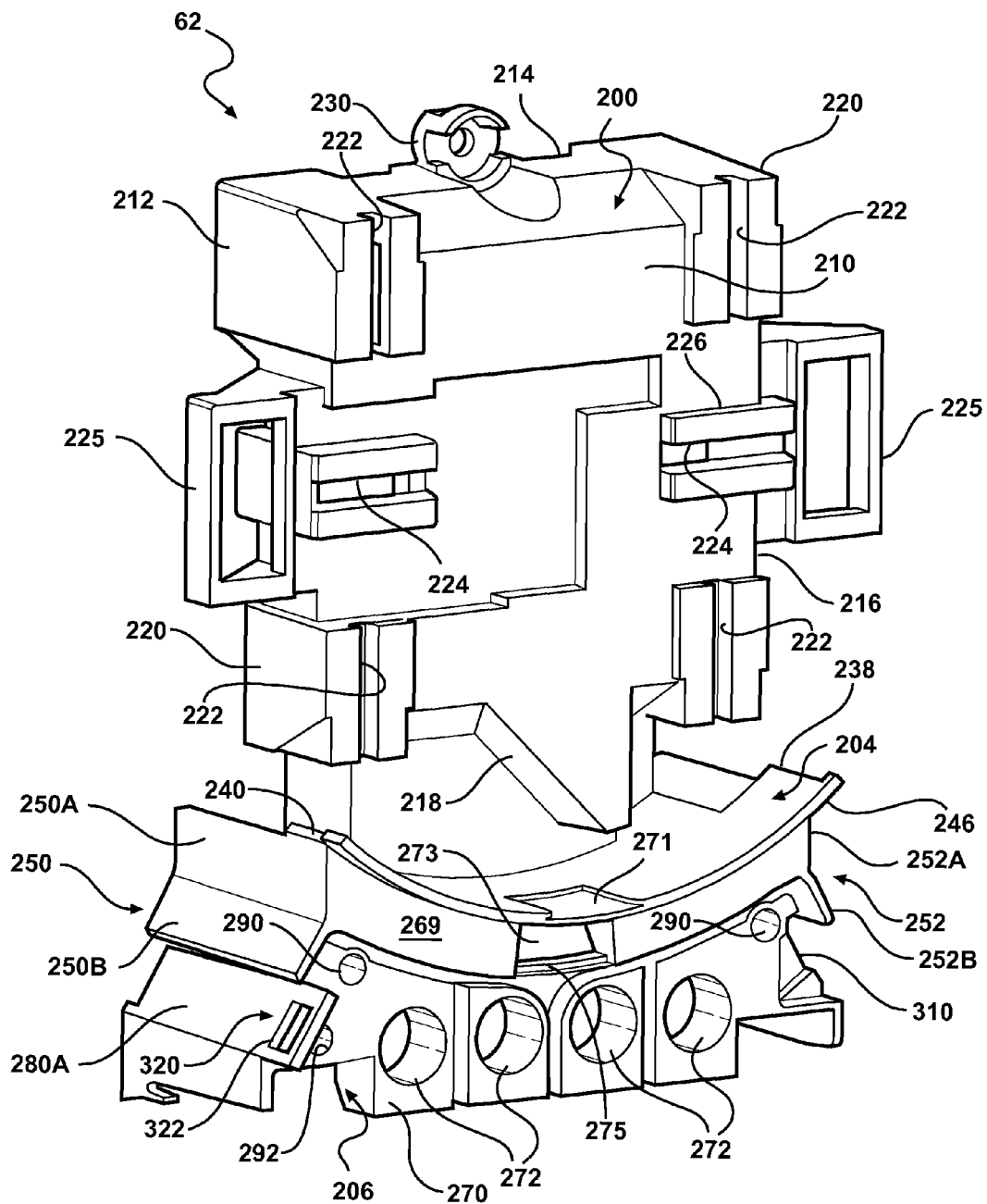
FIG. 9 is a left side front perspective view of the socket adapter front cover.
Figure 11:
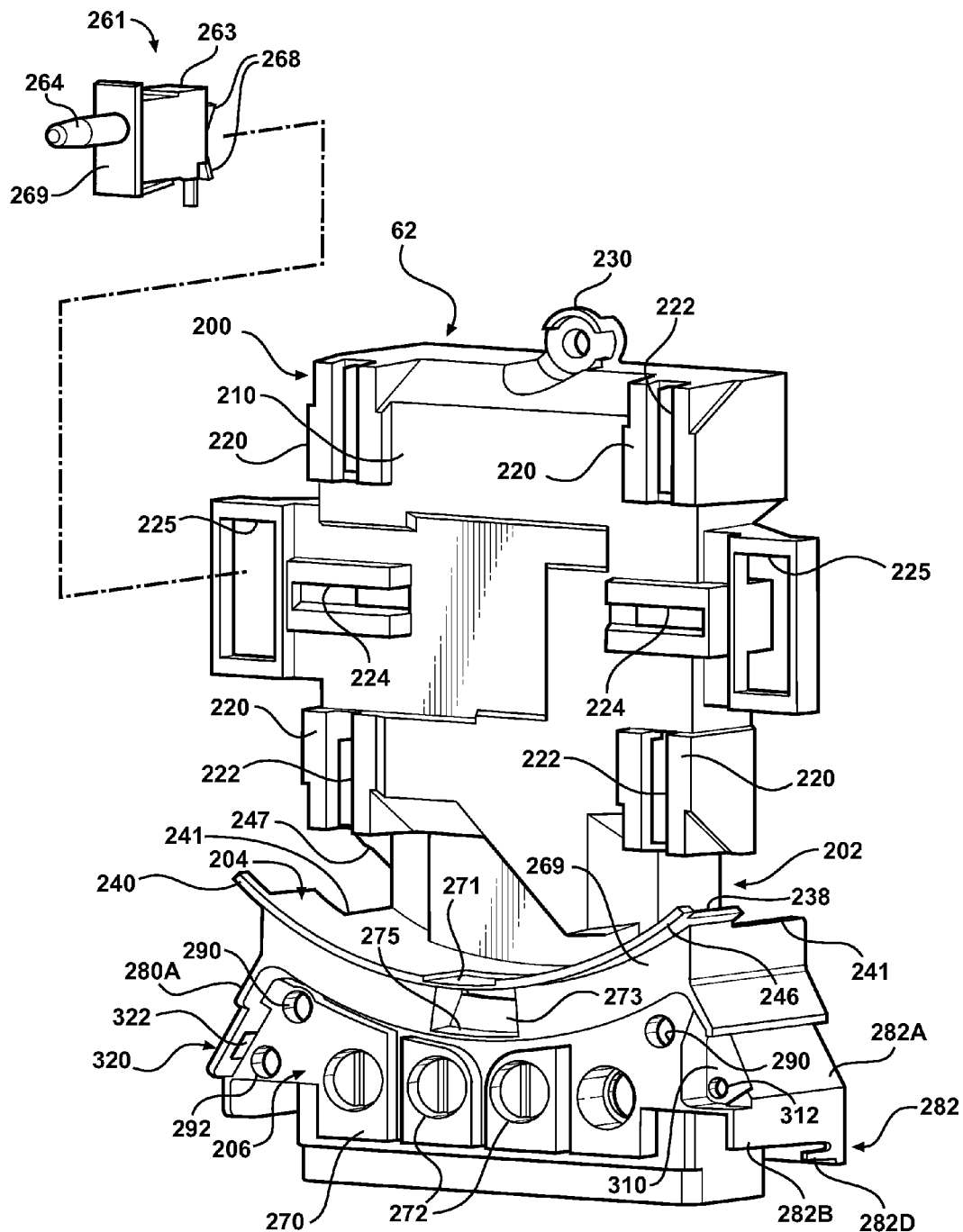
FIG. 11 is a right side front view of the socket adapter front cover.

An arcuate shaped wall 269 depends below the rim edge 246 between the side flange assemblies 250 and 252. As shown in FIGS. 8A, 9, and 11, a knockout 271 is provided in the rim filler 204 and the wall 269. The knockout includes a recessed inner wall 275 formed along the rim edge 246, generally intermediate the ends of the flanges 238 and 240 of the rim filler 204. A second wall 273 is formed in a recess extending rearward of the wall 269. The wall 273 and/or the wall 271 may be knocked out or cut away from the rim filler 204 and the wall 269 to enable external conductors or cables to be passed through the front housing 62 to connection with components mounted on the rear housing 60. Alternatively, a slide in strain relief can be mounted in the knockout walls 271 and 273 to protect the conductors or cables passing therethrough.

A wall 270 projects downward from the wall 269 below the side flange assemblies 250 and 252. The wall 270 has a plurality of through bores 272, one for each of the terminals 130. The bores 272 align with and allow access to the fasteners 144 mounted in the terminals 130 to electrically connect line and low power conductors to the conductors 150, 152, 154 and 156.

On the rear surface of the front housing 62, as shown in FIG. 10, cylindrical sleeves 274 extend from the wall 70 and surround the outer periphery of one of the heads of the screw-type fasteners 144.

Side mount assemblies 280 and 282, which are minor images of each other, are carried on the lateral outer ends of the wall 270. Each side mount assembly 280 and 282 includes an upper flange 280A and 282A, respectively. The upper ends of the upper flanges 280A and 282A underlie and are spaced from the bottom flanges 250B and 252B to define a slot for receiving an upper corner portion of a terminal cover 330 as described hereafter.

Each side mount assembly 280 and 282 also includes a depending wall 280B and 282B, respectively, and a rear wall 280C and 282C, respectively. Fingers 280D and 282D project frontward from the rear walls 280C and 282C, and are spaced below the lowermost edge of the depending walls 280B and 282B, respectively. Top walls 280E and 282E project from the rear wall 280C and 282C below the upper flanges 280A and 282A.

The upper flange 280A and the wall 280B, as well as the opposed angled flange 282A and wall 282B, act as mounting surfaces for a complementary shaped portion of the terminal cover 330 as described hereafter. The fingers 280D and 282D serve as inner supports for the sidewalls of the terminal cover 330.

One or a pair of upper bores 290 are formed in the wall 270, see FIGS. 9 and 11. The upper bores 290 allow access to the threaded fastener 185 mounted in the potential terminal body 184 as shown in FIG. 4.

A lower bore 292 is also formed in the wall 270 below one of the upper bores 290 and adjacent to the side mount upper flange 280A. As seen in FIG. 10, a cylindrical sleeve 294 projects rearward from the wall 270. The lower bore 292 extends through the sleeve 294.

Figure 14:
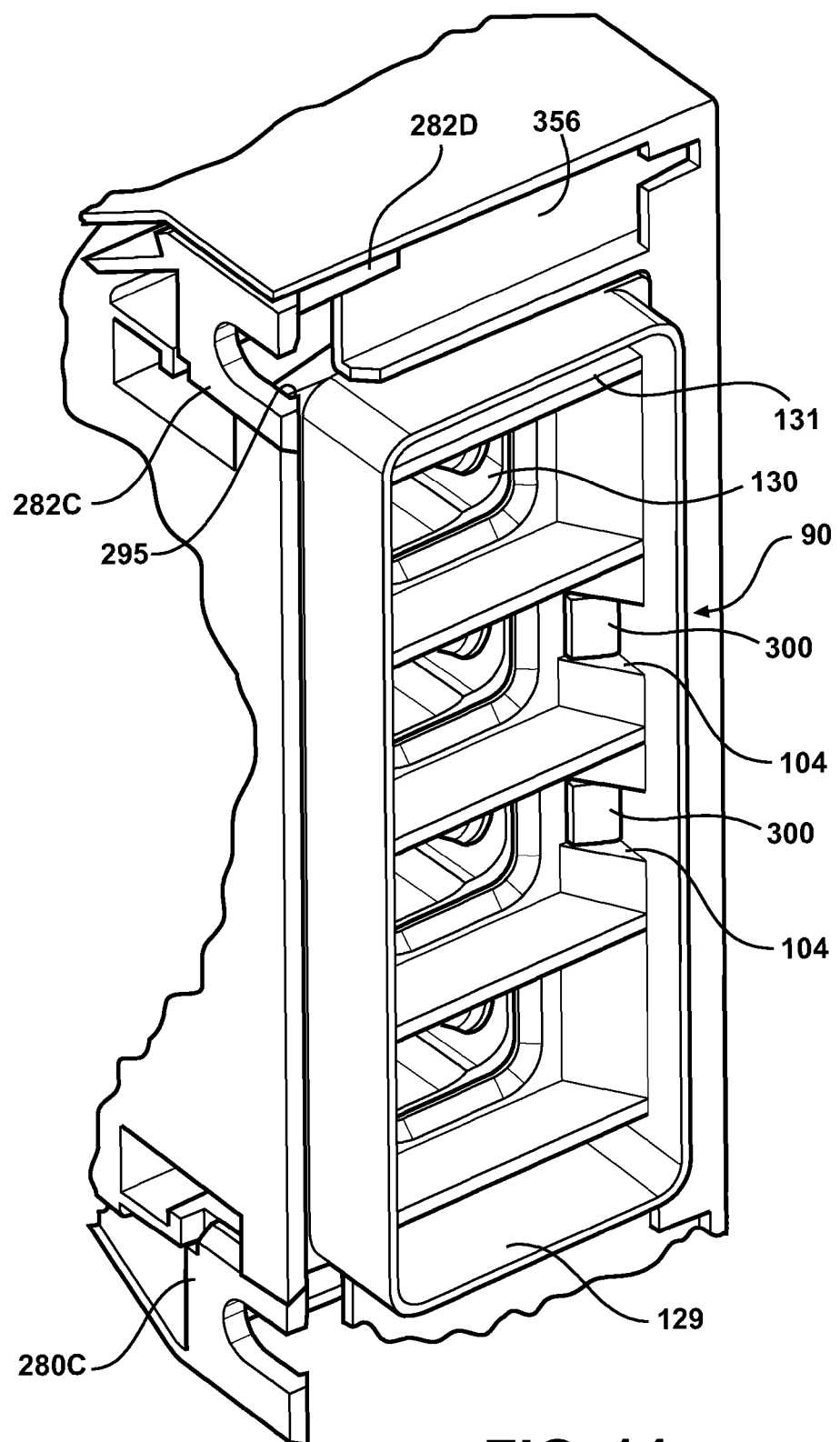
FIG. 14 is an enlarged, perspective view showing the front housing front center mounting members in an assembled position with the rear housing base.

As shown in FIGS. 10 and 14, the front housing 62 is provided with at least one or a pair or more of surfaces 300 extending from a lower edge of the wall 270 generally located below the two central most bores 272. The surfaces 300 have a hook 302 projecting below the bottom edge of the wall 270.

When the front housing 62 is engaged in the rear housing 60, the surfaces 300 extend through the apertures 104 in the terminal portion 206 of the front housing 62 until the hooks 302 snap behind and into engagement with the peripheral edge 90 of the terminal portion 206 of the front housing 62. This securely engages the bottom portion of the front housing 62 with the bottom portion of the rear housing 60.

Figure 12:
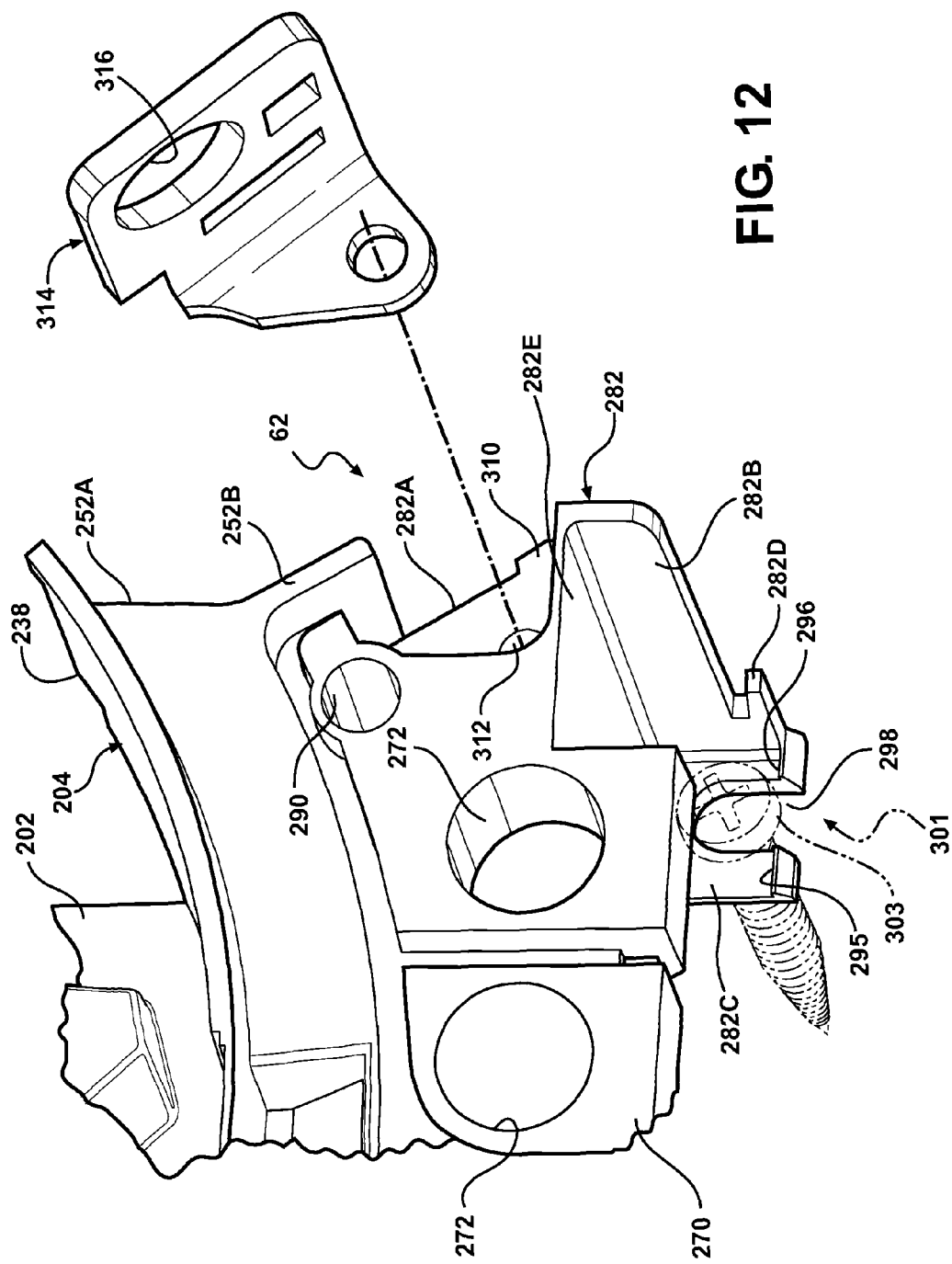
FIG. 12 is an enlarged, perspective view depicting the front cover rear mounting snaps.

An attachment or engagement means is provided on the rear walls 280C and 282C of the front housing 62 as shown in FIGS. 10 and 12. The attachment means includes at least one and, for example only, a pair of hooks 295 and 296 which are carried at an end of the rear walls 280C and 282C and project under the top walls 280E and 282E. An aperture, such as an open ended aperture or slot 298, is formed in the rear walls 280C and 282C and is sized to receive the shank of a mounting fastener 301 shown in phantom in FIG. 12 to attach the entire socket adapter 40 to a mounting surface. The enlarged head 303 of the fastener 301 is engaged by the one or more hook attachments 295 and 296. The fastener head 302 is thus captured between the bottom edge of the wall 270 and the hooks 295 and 296. This resists any movement of the front housing 62 or the entire socket adapter 40 when an upward directed force is exerted on the socket adapter 40, such as when a watthour meter is disengaged from the jaw contacts 150, 152, 154, and 156 in the socket adapter 40.

The open ended aperture or slot 298 in the rear walls 280C and 282C can be applied to existing watt hour meter socket adapters which have a single piece housing configuration formed of a base and a sidewall, with or without an internal jaw contact covering shield. The rear walls 280C and 282C can be formed as extensions of the base and/or sidewall of existing socket adapters so as to simplify the mounting of the socket adapter on a mounting surface in a socket or panel enclosure by simply allowing the mounting fasteners to be first attached to the socket adapter mounting surface and then the entire socket adapter slid over the fasteners for mounting. The hooks 295 and 296 capture the fastener heads, as described above, to aid in resisting separation of the socket adapter of the mounting surface when a watthour meter is removed from the socket adapter.

This use of the open ended slots to mount the socket adapter on a mounting surface adds additional safety to the installation and removal of socket adapters to such mounting surfaces in a socket or panel enclosure since the initial mounting of the fasteners to the mounting surface is simple and straight forward and does not require the insertion of such fasteners through sleeves in the socket adapter housing which then must be matched with and inserted into previously drilled apertures in the mounting surface prior to tightening the fasteners to fix the socket adapter on the mounting surface. It is difficult to handle the typically small fasteners which can easily fall from the socket adapter during the mounting process and create the potential for a dangerous arc flash within the socket or panel if the metal fastener contacts a live electrical component.

The slot 298 could also be in the form of a closed aperture which receives the fastener shank. In this configuration, the hooks 295 and 296 are not required as the continuous extent of the rear walls 280C and 282C surrounding the entire aperture 298 will resist any movement of the front housing 62 relative to the fastener.

In addition, the fingers, such as fingers 280D and 282D, underlie a portion of a terminal cover 330 to aid in resisting upward forces exerted on the terminal cover 330.

Figure 5C:
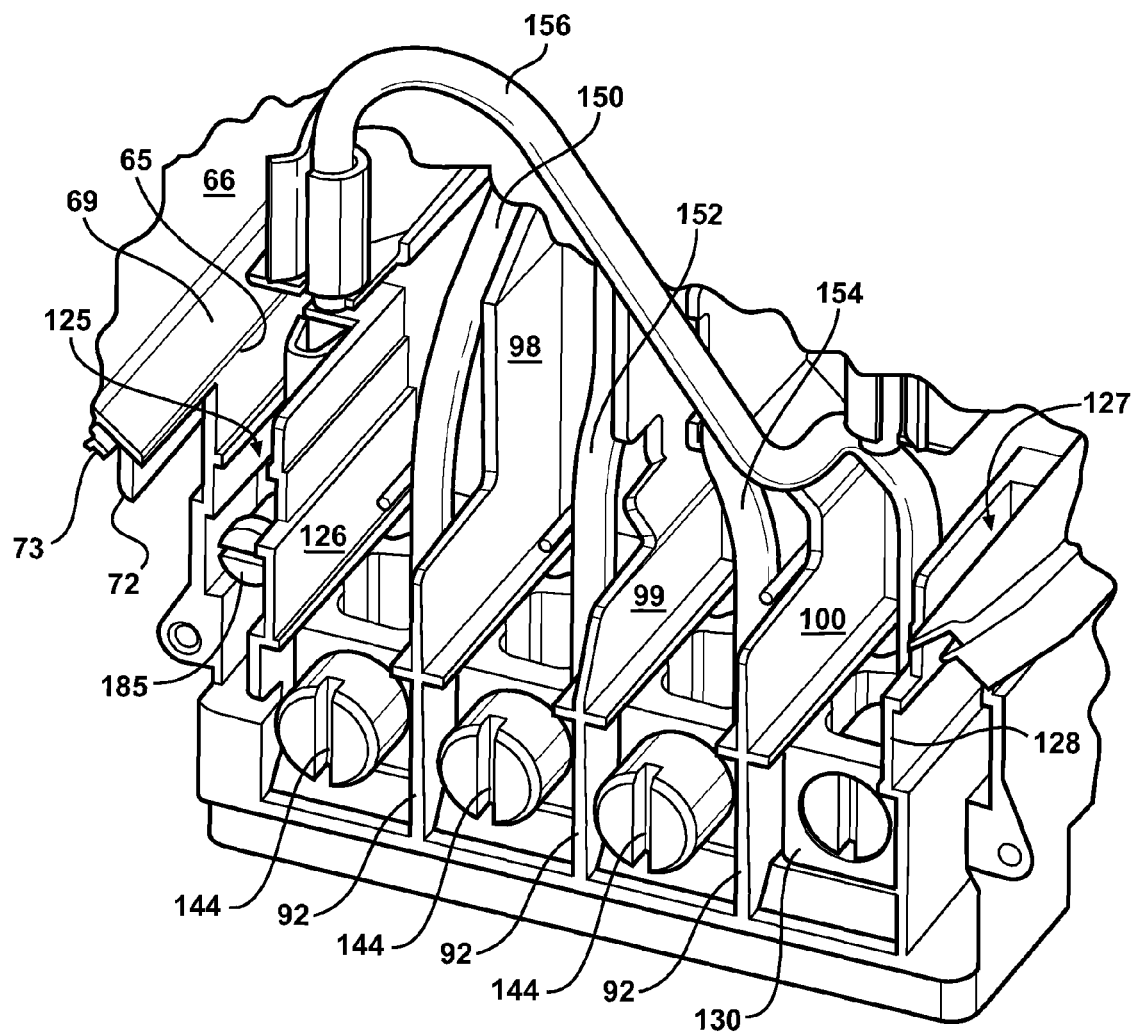
FIG. 5C is an enlarged, perspective view of a lower portion of the socket adapter shown in FIG. 5A.

Further separation resistance is provided by another combination of features in the socket adapter including complementary interferingly arranged members or surfaces. As shown in detail in FIG. 8B, a notch 241 is formed adjacent the ends of each flange 238 and 240 on the rim filler 204 between the flanges 238 and 240 and the upper wall flanges 250A and 252A. The notch 241 fits closely around an end portion of the inner walls 126 and 128. Each of the barriers 98, 99, and 100 between the inner walls 126 and 128 is notched at an outer end, as shown in FIG. 5C, to accommodate the curved shape of the rim filler 204.

The notched configuration of the rim filler 204 and the close engagement of the flanges 238 and 240 of the rim filler 204 in the slots 77 from the spaced ends of the sidewall 66, and the fit between the surfaces of the notches 241 and the end portions of the inner walls 126 and 128 creates an interference between the front housing 62 and the rear housing 60 which resists upward tilting movement of the front housing 62 relative to the rear housing 60 such as might occur when a watthour meter is being disengaged from the socket adapter by an upwards tilting movement of the watthour meter relative to the socket adapter 43.

A recessed surface 310 is formed at one side end of the wall 270 as shown in FIG. 11. A bore 312 extends through the surface 310 and through the remaining portion of the wall 270. The bore 312 receives a fastener, such as a screw, which mounts an L-shaped clip 314 shown in FIG. 8A, which may be formed of metal, in the recessed surface 310 next to the adjacent edge of the wall 270. The L-shaped clip 314 has an aperture 316 adjacent an outer end.

As shown in FIG. 3, a sleeve 133 with a bore 135, which may be threaded or have a threaded metal insert mounted therein or smooth to receive a self tapping screw, is formed in the rear housing 60 along one lateral side of the terminal portion 56 of the rear housing 60. The fastener or self tapping screw used to mount the clip 314 on the surface 310 of the front housing 62 engages the bore 135 to securely retain the clip 314 on the front housing 62.

As shown in FIGS. 3 and 4, a similar sleeve 137, with a bore 139 extending therethrough which may be threaded or have a threaded metal insert mounted therein, or be smooth to receive a self tapping screw, is formed on the opposite lateral side of the terminal portion 56 of the rear housing 60. A fastener, such as a self tapping screw, not shown, can optionally be inserted through the bore 292 in the front housing 62 and into the bore 139 in the sleeve 137 to provide enhanced securement of the front housing 62 to the rear housing 60 and to prevent separation or pull off of the front cover 62 from the rear housing 60 when a watthour meter is separated from the jaw contacts in the rear housing 60.

As shown in FIGS. 8A, 8B, 9 and 11, a second or supplemental clip 320 is integrally formed with the front housing 62 at a position between the lower side flange 250B and the upper wall 280A. The supplemental clip 320 is formed as a thin flange projecting outward from the outer facing surface 210 of the front housing 62. An aperture, such as a slot 322, is formed between an outer edge of the clip 320 and the sidewall 280A.

Referring now to FIG. 11, the switch 261 is optionally mountable on one of the window-like structures 225 carried on the front housing 62. The switch 261 includes a body 263 with a movable actuator 264 projecting from one surface. At least one and, by example, a pair of spring-mounted tabs 266 are formed on or attached to the body 263 for snap mounting the body 263 to the window-like structure 225 on the front housing 62 after the body 263 of the switch 260 has been inserted through the aperture in the window-like structure 225. One or a pair of biasing arms 268 may be provided on the rear surface of the body 263. The arms 268 engage the base plate 64 of the rear housing 60 to bias the actuator 264 outward as well as to maintain engagement of a faceplate 269 on the body 263 with the window-like structure 225 on the rear housing 60.

Figure 15:
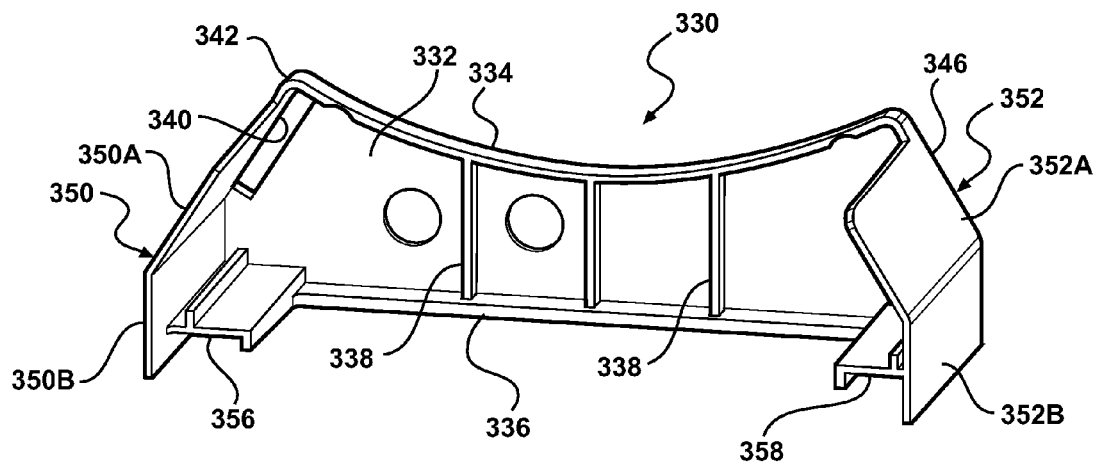
FIG. 15 is a rear perspective view of the terminal cover shown in FIG. 1.
Figure 20:
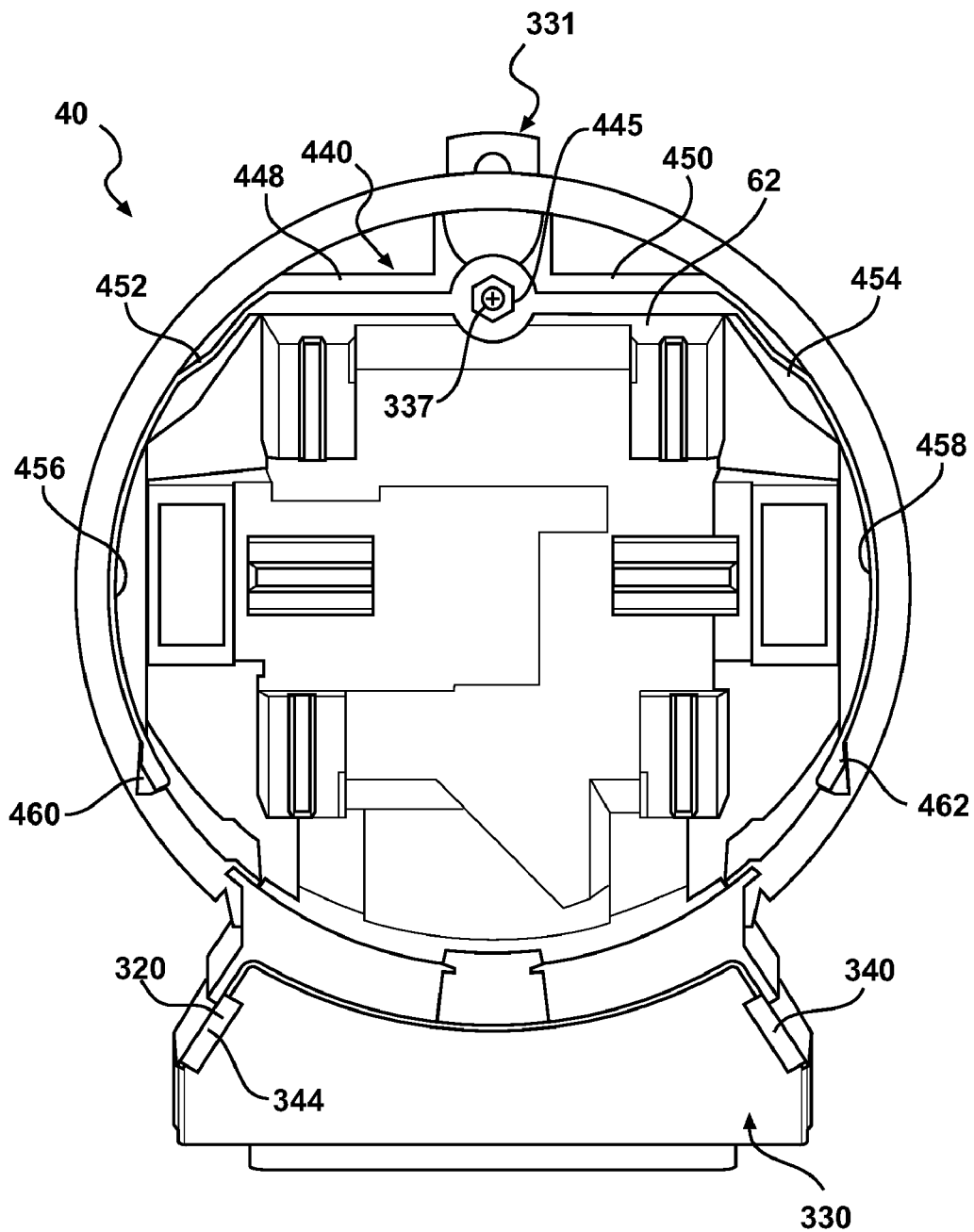
FIG. 20 is a front perspective view of another aspect of a watthour meter socket adapter having a replaceable surge guard assembly.
Figure 21:
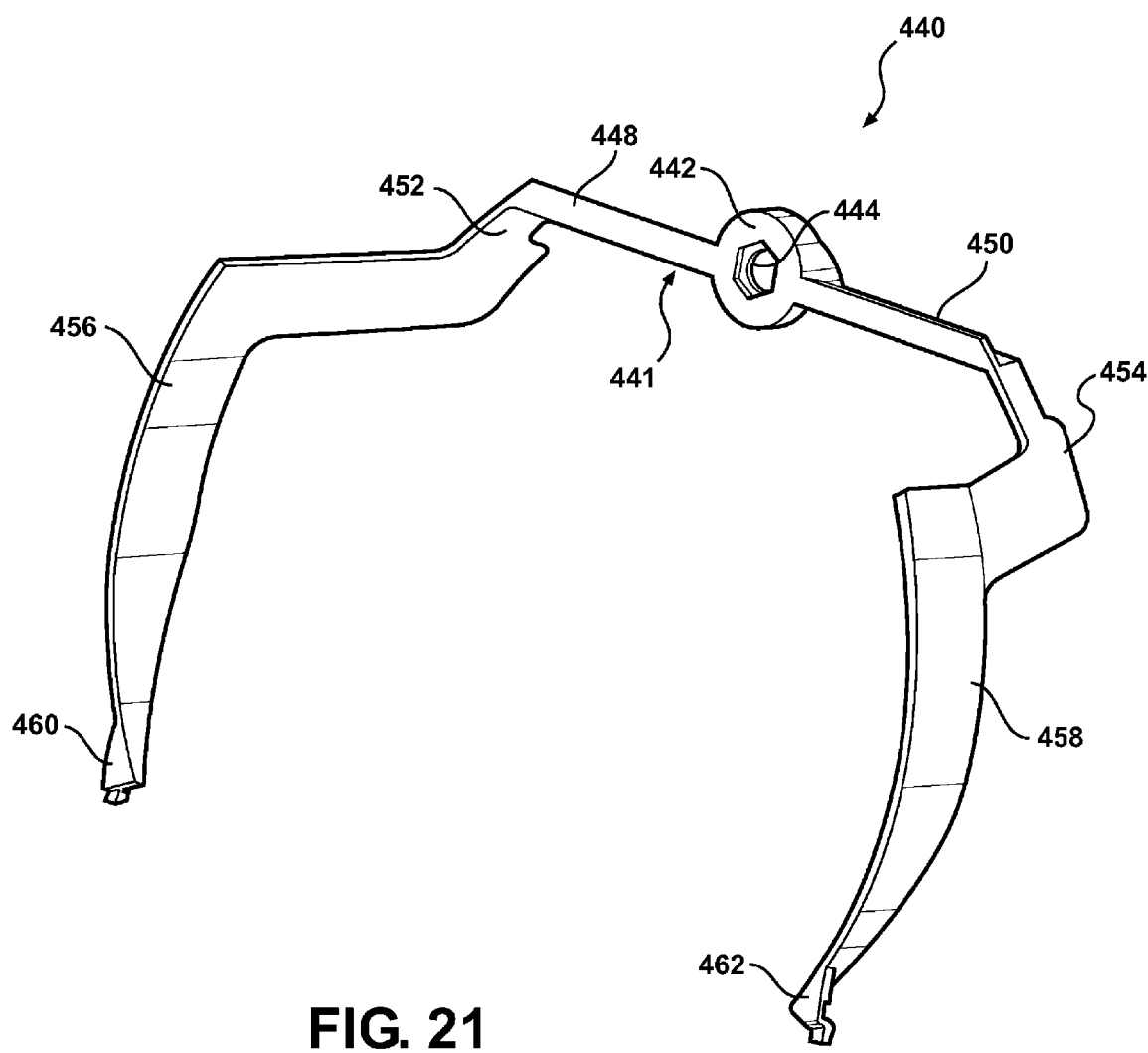
FIG. 21 is an enlarged perspective view of the surge guard conductor shown in FIG. 20.
Figure 22:
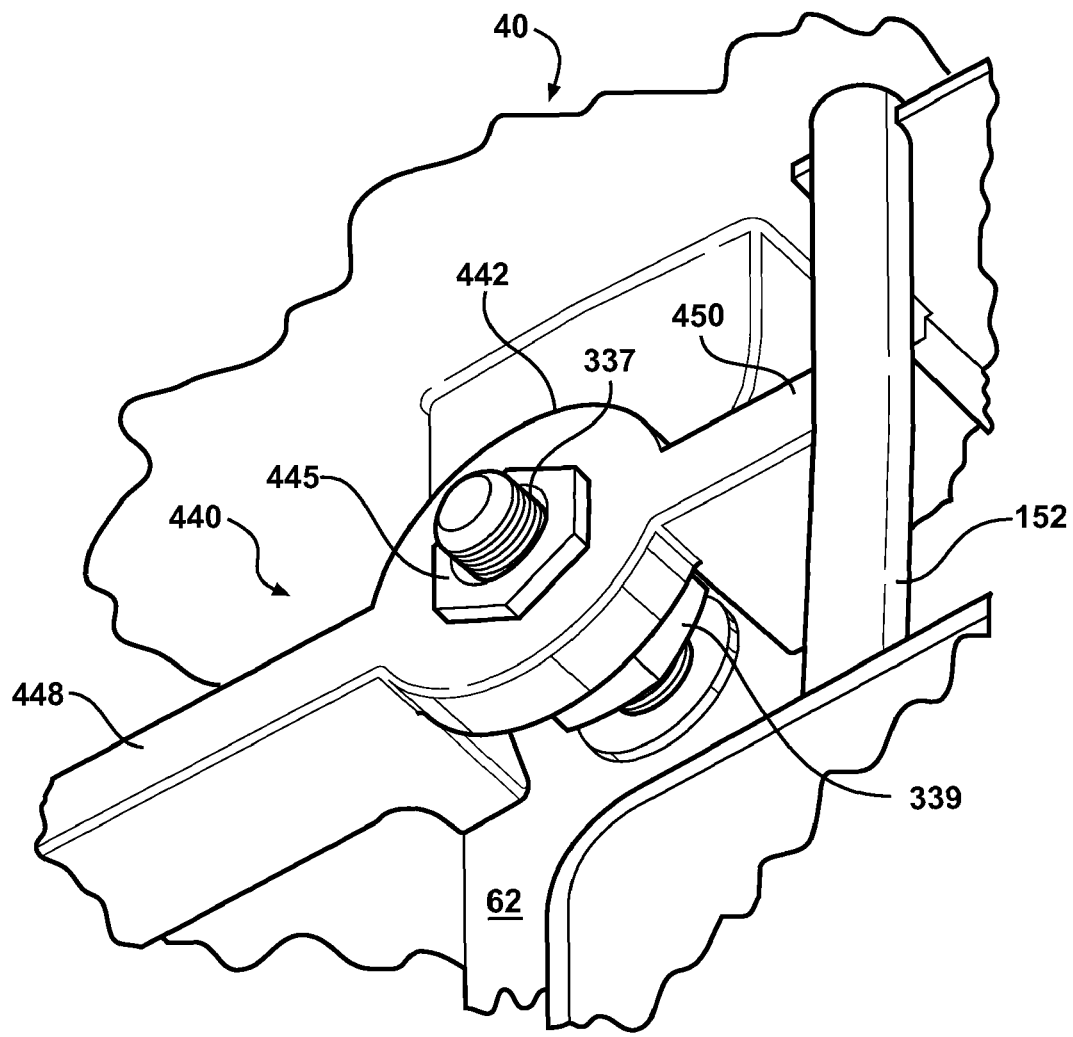
FIG. 22 is an enlarged perspective view showing the interior attachment of the surge guard conductor to the socket adapter hanger fastener.

As shown in FIGS. 1, 15, and 20, the terminal cover 330 is removably attachable to the joined rear housing 60 and front housing 62 to cover and block access to the terminals 130 as well as the interior of the socket adapter 40. The terminal cover 330 can be made as a one-piece molded body of a suitable electrical insulating plastic.

The terminal cover 330 includes a transversely extending wall 332 having an upper rearward extending, generally arcuate flange 334 and a bottom edge located rib 336. Additional strengthening ribs 338 may be provided on the rear surface of the wall 332 between the flange 334 and the rib 336.

Figure 2:
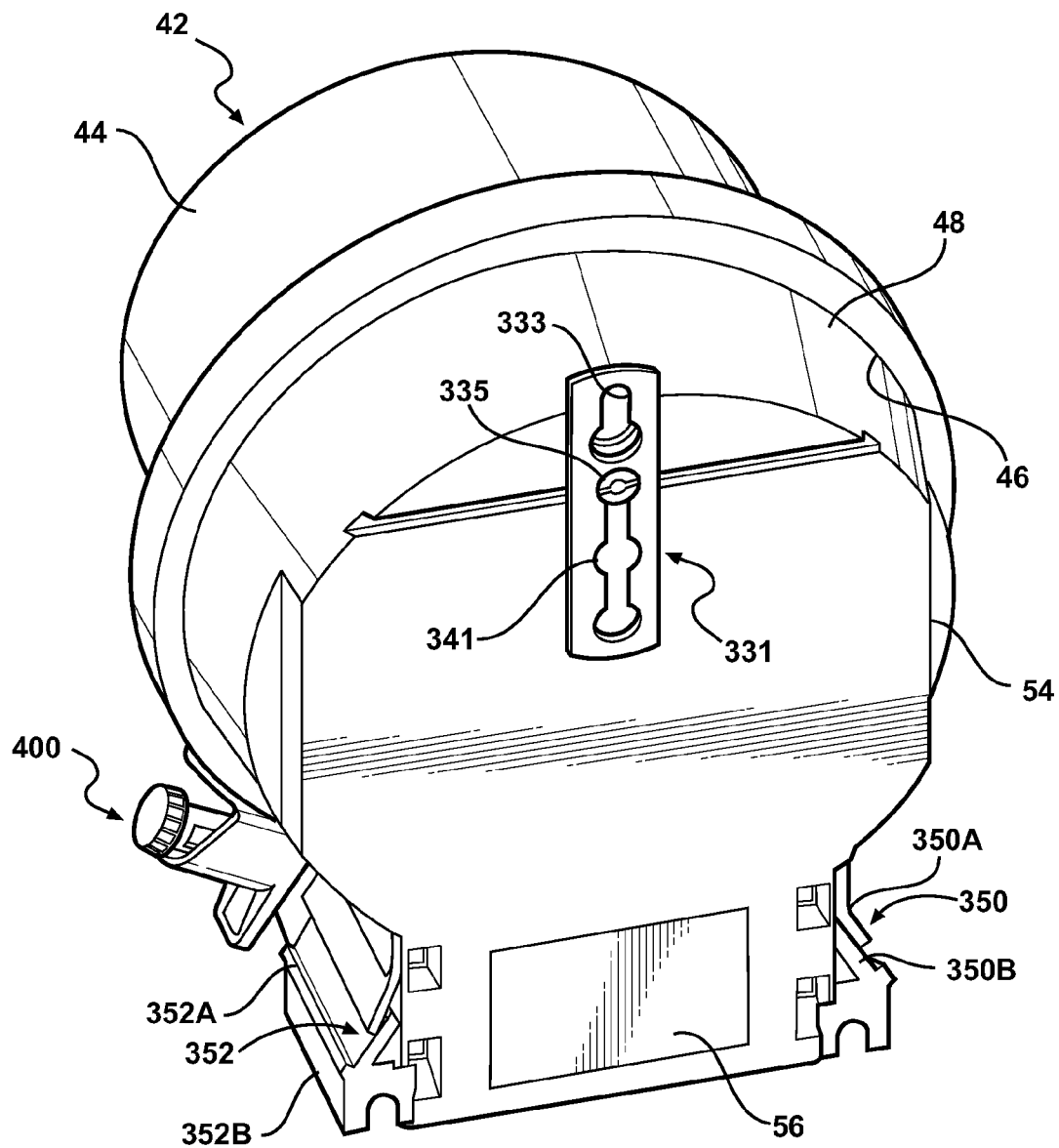
FIG. 2 is a rear perspective view of the socket adapter shown in FIG. 1.

A first aperture such as a slot 340 is formed in the wall 332 adjacent a first side edge 342. A second aperture, such as a second slot 344, is formed adjacent to an opposed second side edge 346. A first sidewall 350 formed of a first or upper wall portion 350A and a second lower wall portion 350B is formed along the first side edge 342 and extends rearward from the wall 332. A similar second sidewall 352 also formed of a first angularly oriented upper wall 352A and a second lower wall 352B extending from the second side edge 346. The overall length and shape of the first and second sidewalls 350 and 352, including the respective upper and lower sidewall portions 350A, 350B, 352A and 352B conform to the shape of the sidewall portions 280 and 280A of the front housing 62 when the upper wall portions 350A and 352A are inserted into the slot or opening formed between side flanges 252B and the upper wall 282A and the opposed lower side flange 250B and the upper wall 280A. This is shown in FIG. 2.

When the terminal cover 330 is mounted over the joined front housing 62 and rear housing 60, the clip 314 extends through the first aperture 340. Likewise, the integral mounting clip 320 will extend through the second aperture 344. The aperture 322 in the clip 320 formed between the outer end portion of the clip 320 and the wall 332 of the terminal cover 330 can receive a wire or plastic padlock seal to indicate any tampering with the terminal cover 330.

Figure 13:
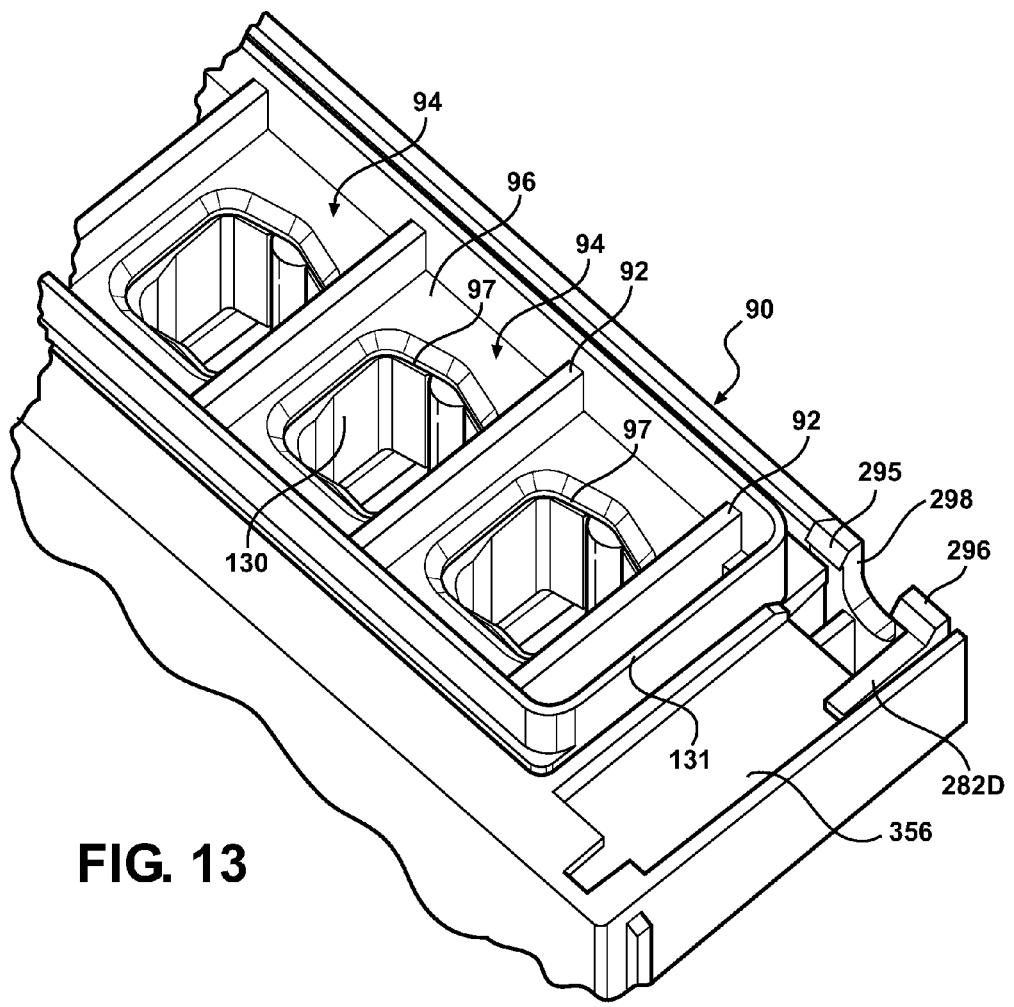
FIG. 13 is an enlarged, partial, bottom perspective view showing the position of the front cover rear mounting snaps in an assembled state with the socket adapter base.

As also shown in FIGS. 13 and 15, a pair of recessed wall structures 356 and 358 is formed interiorly on the terminal cover 330 and extend inward from the wall 332 and the lower sidewalls 350B and 352B, respectively. As shown in FIG. 13, the recessed wall structures 356 and 358, only wall structure 356 being shown in FIG. 13, form a shallow recess which is adapted for receiving one of the fingers 280D or 282D to aid in preventing upward movement of the socket adapter 40 when a watthour meter is pulled from the jaw contacts 10 in the watthour meter 40.

Figure 16:
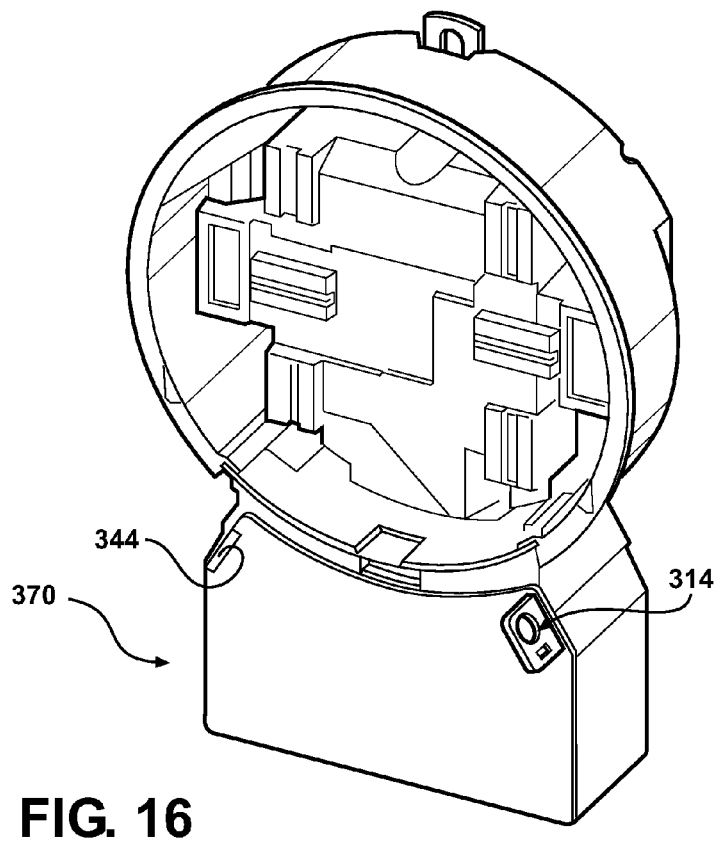
FIG. 16 is a perspective view of another aspect of a watthour meter socket adapter depicting a terminal portion and a terminal cover.
Figure 17:
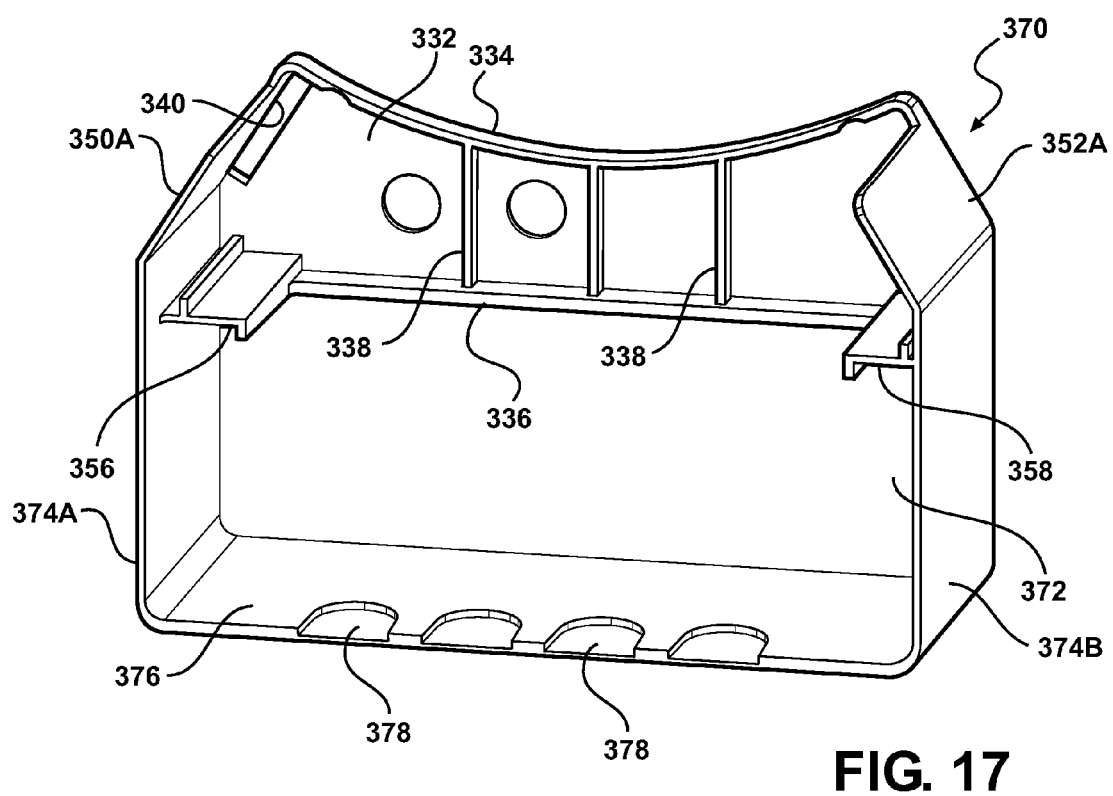
FIG. 17 is a rear perspective view of the terminal cover shown in FIG. 16.

An alternate terminal cover 370 is shown in FIGS. 16 and 17. The terminal cover 370 has several features which are substantially identical to the terminal cover 330 and like reference numbers are used to identify identical components or features of both terminal covers 330 and 370.

The alternate terminal cover 370 has the wall 332, the arcuate upper rim flange 334, the lower edge rib 336, the strengthening ribs 338, the first aperture 340, the opposed side aperture 344, the upper sidewalls 350A and 352A, and the inner wall structures 356 and 358. In this aspect, the wall 332 has an elongated length including the lower portion 372, elongated lower sidewalls 374A and 374B which project respectively from the upper sidewalls 350A and 352A, and a bottom wall 376. One or more knock-out portions 378 or apertures are formed in the bottom wall 376 between spaced solid portions of the bottom wall 376 to allow access of end portions of electrical line and load power conductors into the interior of the terminal cover 370 for connections to the terminals 130 as described above.

The terminal cover 370 forms a substantially closed housing about the end connections between the electric line and load power line conductors and the terminals 130 as compared to the open bottom arrangement provided by the terminal cover 330. The terminal cover 370 can be employed with a socket adapter housing structure that does not include a front housing 62.

Figure 18:
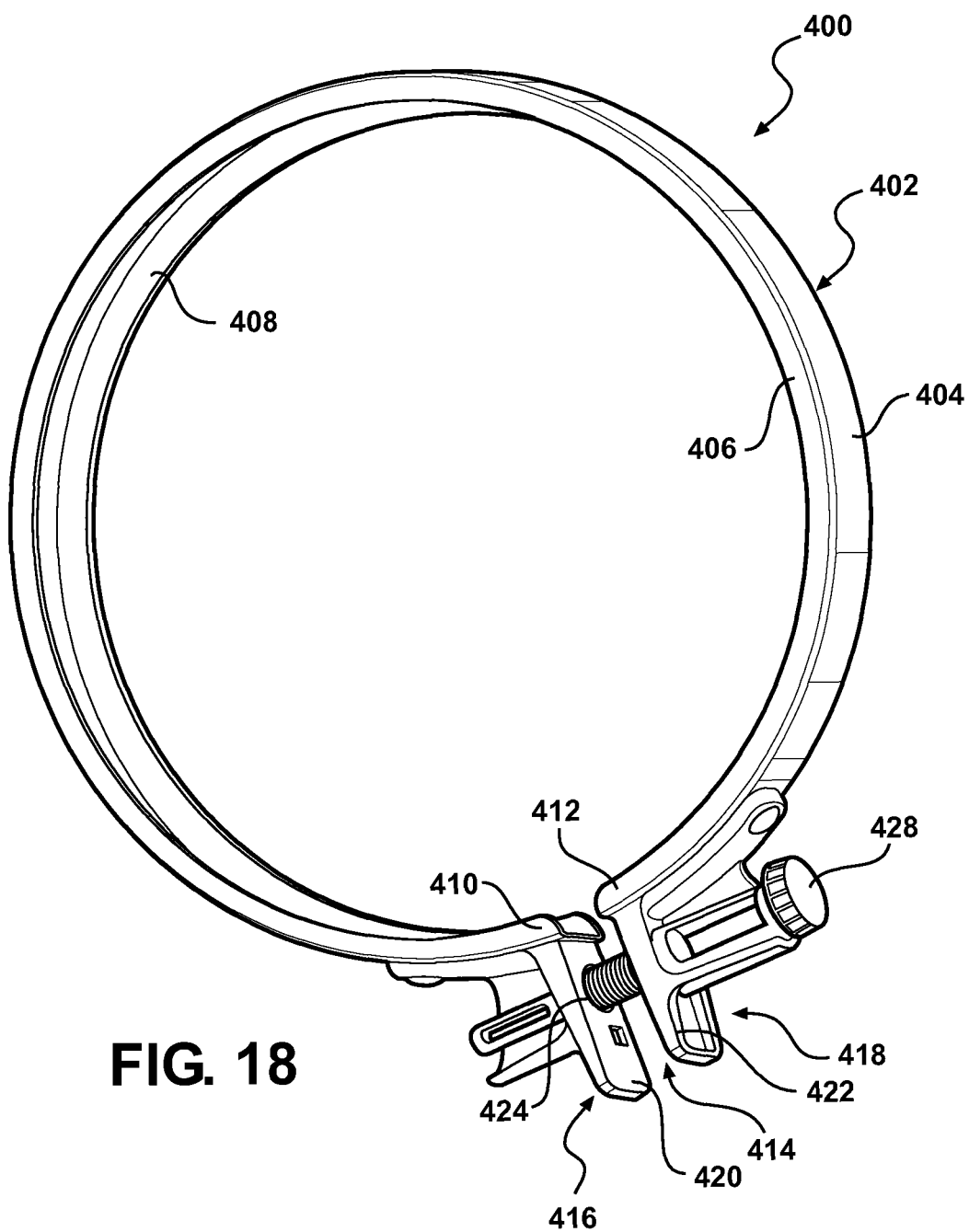
FIG. 18 is a perspective view of the ring lock clip shown in FIG. 1.
Figure 19:
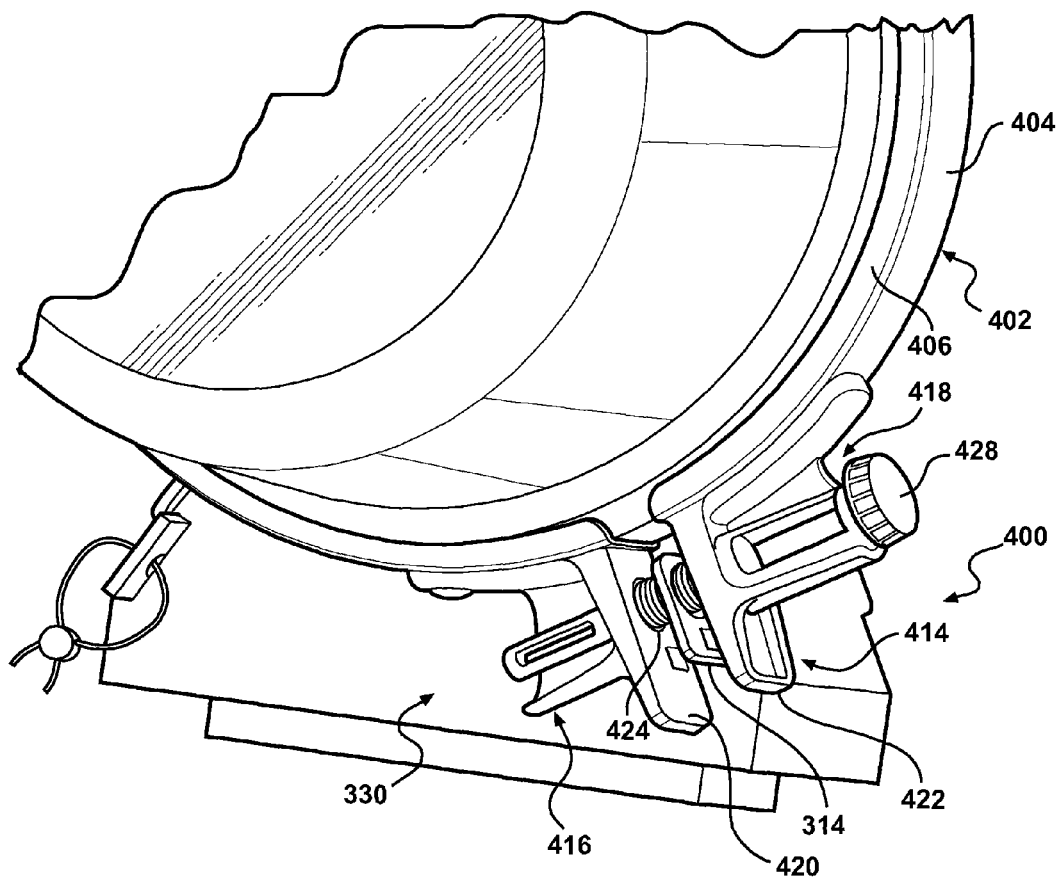
FIG. 19 is an enlarged perspective view showing the ring lock clip mounted on the socket adapter and meter mounting flanges and coupled to the terminal cover clip.

Referring now to FIG. 1 and in greater detail to FIGS. 18 and 19, there is depicted a ring lock clip 400, also known as a sealing ring. The ring lock clip 400 may be any type of lock clip used in watthour meter/meter socket adapter applications to secure a watthour meter to a ring-style socket cover, to secure a watthour meter to a watthour meter socket adapter, or to secure a watthour meter socket adapter to a ring style meter socket cover.

The ring lock clip 400 includes a ring-shaped annular band 402 having a central wall 404 and a pair of depending sidewalls 406 and 408. The annular band 402 terminates in spaced ends 410 and 412 which are extensible and retractable relative to each other as the band 402 is tightened or allowed to expand.

A lock mechanism 414, shown by way of example only as including first and second housings 416 and 418, is secured to the central wall 404 of the band 402 adjacent the ends 410 and 412 by means of mechanical fasteners, such as rivets, or adhesive, welds, etc., or as an integral formation at the ends 410 and 412 of the band 402. Each housing 416 and 418 has a radially outward extending endwall 420 and 422, respectively, which projects radially outward from the ends 410 and 412 of the band 402. An aperture 424 is formed in each endwall 420 and 422, respectively, for receiving a fastener 428 having a threaded portion which threadingly engages one of the apertures 424 of the endwalls 420 and 422 to enable tightening and loosening of the ends 410 and 412 of the annual band 402 about the mounting rim 70 of the socket adapter base plate 64, the rim filler flange 204 of the front housing 62 and the mating mounting flange of the watthour meter shown partially by reference number 430 in FIG. 1 to prevent unauthorized separation and/or removal of the watthour meter 42 relative from the socket adapter 40.

As shown in FIGS. 1 and 18, and in greater detail in FIG. 19, the ring lock clip 400 is configured for use with the end portion of the clip 314 projecting through the terminal cover 330. The housings 416 and 418 of the ring lock clip 400 are initially disposed on opposite sides of the clip 314. The fastener 428 is then inserted through the aperture 424 in the housing 418, through the aperture 316 in the clip 314 and then through the aperture 424 in the housing 416 before being threading advanced through the threaded aperture 424 to tighten the band 402 about the mating portions of the watthour meter 42 and the socket adapter 40. This sandwiches the clip 314 between the housings 420 and 422 to provide additional security by resisting attempts to unauthorizedly remove the terminal cover 330 from the socket adapter 40. The clip 400 and the clip 314 may be employed in a socket adapter which does not include a front housing and where the clip 314 is mounted on the rear housing 60.

Referring now to FIGS. 2, 4, 22 and 23, a hanger assembly 331 is mounted on the socket adapter 40 for hanging the socket adapter 40 on a mounting fastener or post, not shown, on a wall or in a socket enclosure. The hanger assembly 331 is in the form of a metal strip having a keyhole shaped mounting aperture 333 at one end. A housing hanger fastener 335 extends through an opening on the base of the plate 64 of the rear housing 60. A shank 337 extending from the head of the housing hanger fastener 335 receives a nut 339, as shown in FIG. 4, to secure the hanger assembly 331 in the desired vertical position relative to the plate 64. As shown in FIG. 2, the hanger assembly 331 includes at least one and typically a plurality of mounting positions 341 for the head of the housing hanger fastener 335.

Referring now to FIGS. 20-24, there is depicted a surge guard assembly 440 which may be removably mounted in the socket adapter 400 before or after the front housing 62 is engaged with and coupled to the plate 64 of the rear housing 60.

A surge guard is used in watthour meter socket adapters to electrically ground a watthour meter mounted in the socket adapter by connecting ground tabs exposed on the rear surface of the meter base to electrical ground.

In order that the surge guard assembly 440 may be mounted in or removed from the socket adapter 40 without first separating the front housing 62 from the rear housing 60, the surge guard assembly 440 is configured as a unitary member or as an assembly of individual components mechanically and electrically joined together to act as a unitary member. By way of example, the surge guard assembly 440 includes an electrical conductor 441 made of an electrically conductive material, such as copper, copper alloy, aluminum, etc.

By way of example, the conductor 441 has a generally centrally located annular boss 442 with a central bore 444 extending therethrough and adapted to be mounted over the threaded shank 337 of the hanger fastener 335. It should be noted, that the end of the threaded shank 337 of the fastener 335, after passing through the hanger 331 receives the nut 339, the base or plate 64 of the rear housing 60 and the collar 230 on the front housing 62, and extends outward from the outer side of the boss 442 on the surge conductor 441. The outer portion of the entire bore 444 may be formed with a hexagonal cross section so as to non-rotatably receive a second fastener or nut 445 to fixedly mount the surge conductor 441 to the socket adapter 40.

A first pair of opposed legs 448 and 450 project oppositely from the boss 442. Slightly curved or arched end pieces 452 and 454 extend angularly from the ends of the legs 448 and 450 and transition into arcuate shaped arms 456 and 458, respectively, which lay in a common plane, spaced from the plane of the legs 448 and 450. Each leg 456 and 458 terminates in radially inward extending tabs 460 and 462, respectively. As shown in FIG. 20, the boss 442 and the arms 448 and 450 of the surge guard conductor 441 are mountable over the shank 337 of the hanger fastener 335 and fit within a recess, seen in FIG. 9, on one surface of the collar 230 on the upper portion of the front housing 62.

The arms 448 and 450 extend inside along the sidewall 214 of the front housing 62. The ends 452 and 454 project angularly from the ends of the arms 448 and 450 so as to position the arcuate shaped legs 456 and 458 in a concentric manner along the inner surface of the sidewall 66 of the rear housing 60. This enables the tabs 460 and 462 to fit within shallow recesses 464 and 466, shown in FIGS. 3, 4, and 8A, in the mounting flange or rim 70 of the sidewall 66 of the rear housing 60 and, in a recess 63 in the inner surface of the sidewall 66 shown in FIGS. 3 and 4. In this position, the tabs 460 and 462 are positioned to engage the one or more ground tabs on the rear surface of the base of the watthour meter 42 when the watthour meter 42 is mounted in the socket adapter 40.

The surge guard assembly 440 may also be removably mounted in a socket adapter which has only a rear housing 60.

What is claimed is:

1. A watthour meter socket adapter for use with a watthour meter having a plurality of blade terminals extending from a meter base, the watthour meter socket adapter comprising:
    a rear housing including a base adapted to receive the watthour meter;
    contacts disposed in the base adapted to receive the watthour meter blade terminals;
    a front housing attachable to the rear housing and covering the contacts while allowing the watthour meter blade terminals to be inserted into the contacts; and
    at least one attachment aperture formed in the front housing adapted to receive a fastener through the front housing engageable with a socket adapter mounting surface independent of the rear housing for resisting separation of the front housing from the rear housing when the watthour meter connected to the contacts in the base is being disengaged from the contacts.

2. The watthour meter socket adapter of claim 1 further comprising:
    the fastener having a shank extending through the at least one attachment aperture and an enlarged head;
    the at least one attachment aperture being an open-ended slot; and
    at least one hook member carried on the front housing engageable with the head of the fastener to prevent separation of the fastener from the at least one attachment aperture and to resist movement of the front housing relative to the rear housing.

3. The watthour meter socket adapter of claim 1 further comprising:
    at least one hook member carried on one of the front housing and the rear housing engageable with at least one hook receiving surface carried on the other of the front housing and the rear housing.

4. The watthour meter socket adapter of claim 3 wherein:
    the at least hook member includes at least two spaced hook members; and
    the at least one hook receiving surface includes at least two spaced surface hook engaging members.

5. The watthour meter socket adapter of claim 3 wherein:
    the at least one hook receiving surface includes an aperture in the rear housing intermediate opposed lateral sides of the rear housing; and
    the at least one hook member carried on front housing slidingly engageable with the aperture of the rear housing when the front housing and rear housing are joined.

6. The watthour meter socket adapter of claim 1 further comprising:
    terminals in the rear housing connectable to electric line and load power conductors;
    a terminal cover mountable over terminals in the rear housing and attachable to the at least one of the front and rear housing; and
    a clip integrally formed on the front housing and extendable through an aperture in the terminal cover when the terminal cover is mounted on the joined front and rear housings, the clip adapted for receiving a terminal cover seal.

7. The watthour meter socket adapter of claim 6 further comprising:
    an aperture formed in a portion of the clip extendable outward through the terminal cover when the terminal cover is mounted on the one of the front housing and the rear housing.

8. The watthour meter socket adapter of claim 6 further comprising:
a supplemental clip carried on the front housing, the supplemental clip extendable through another aperture in the terminal cover when the terminal cover is mounted on the joined front and rear housings; and
an aperture formed in an end portion of the supplemental clip disposed exteriorly of the terminal cover adapted for receiving a terminal cover seal.

9. The watthour meter socket adapter of claim 1 further comprising:
a hanger carried externally on the rear housing;
a housing hanger fastener extendable through the hanger into the rear housing; and
a surge conductor removably mountable in the rear housing independent from the front housing by the housing hanger fastener without requiring disengagement of the front housing and the rear housing from a watthour meter socket adapter mounting surface.

10. The watthour meter socket adapter of claim 9 further comprising:
the front housing having an aperture for receiving the housing hanger fastener;
the fastener securing an end portion of the front housing and the rear housing together.

11. The watthour meter socket adapter of claim 10 further comprising:
the surge conductor securable to the hanger fastener exteriorly of the front housing to permit the surge conductor to be mounted in the front housing without first separating the front housing and the rear housing from a socket adapter mounting surface.

12. The watthour meter socket adapter of claim 1 further comprising:
terminals in the rear housing connectable to electric line and load power conductors;
a terminal cover mountable over the terminals and engageable with the rear housing, the terminal cover having a wall extending from an upper end, the wall and the upper end defining a cavity adjacent to the terminals, the terminal cover enclosing substantially all exterior portions of the terminals.

13. The watthour meter socket adapter of claim 12 wherein the terminal cover further comprises:
a front wall, a pair of spaced sidewalls joined at one end to the front wall and projecting away from the front wall, a bottom wall extending between the sidewalls substantially between the front wall and opposed ends of to the sidewalls closing one surface of the terminal cover, the front wall, the sidewalls and the bottom wall of the terminal cover enclosing end portions of conductors connected to the terminals.

14. The watthour meter socket adapter of claim 13 further comprising:
openable apertures carried in the bottom walls allowing the conductors to pass through to a connection to one of the terminals.

15. The watthour meter socket adapter of claim 14 wherein: the openable apertures are spaced apart along the bottom wall by portions of the bottom wall.

16. A watthour meter socket adapter for use with a watthour meter having a plurality of blade terminals extending from a meter base, the watthour meter socket adapter comprising:
a rear housing including a base adapted to receive the watthour meter;
contacts disposed in the base adapted to receive the watthour meter blade terminals;
a front housing attachable to the base and covering the contacts while allowing the watthour meter blade terminals to be inserted into the contacts; and
at least one attachment aperture formed in the front housing adapted to receive a fastener engageable with a socket adapter mounting surface for resisting separation of the front housing from the rear housing when the watthour meter connected to the contacts in the base is being disengaged from the contacts;
a hanger carried externally on the rear housing;
a housing hanger fastener extendable into engagement with the hanger through the rear housing adapted to be engaged with a socket adapter mounting surface; and
a surge conductor removably mountable in the front housing by the housing hanger fastener, the surge conductor including a unitary, electrically conductive body including a boss with a bore adapted to receive the hanger fastener, a pair of arms extending from the boss, end pieces extending from outer portions of the arms and transitioning into legs mountable adjacent an inner surface of the rear housing, and a tab carried on the end of each leg adapted to be mounted in a position adapted to engage a ground contract on a watthour meter inserted into the joined front and rear housings.

17. A watthour meter socket adapter for use with a watthour meter having a plurality of blade terminals extending from a meter base, the watthour meter socket adapter comprising:
a rear housing including a base adapted to receive the watthour meter;
contacts disposed in the base adapted to receive the watthour meter blade terminals;
a front housing attachable to the base and covering the contacts while allowing the watthour meter blade terminals to be inserted into the contacts;
at least one attachment aperture formed in the front housing adapted to receive a fastener engageable with a socket adapter mounting surface for resisting separation of the front housing from the rear housing when the watthour meter connected to the contacts in the base is being disengaged from the contacts;
a ring lock clip having a band and a lock mechanism carried on the band releasably locking the band about a watthour meter and a sidewall of the rear housing; and
a projection carried on one of the rear housing and the front housing extending from the one of the rear housing and the front housing, the projection engageable with the lock mechanism when the lock mechanism locks the band about the front and rear housing of the socket adapter and a watthour meter.

18. The watthour meter socket adapter of claim 17 wherein: the projection is carried on the front housing.

19. The watthour meter socket adapter of claim 18 wherein: the projection extends through a terminal cover mounted over a terminal portion of the front housing and the rear housing.

20. A watthour meter socket adapter for use with a watthour meter having a plurality of blade terminals extending from a meter base, the watthour meter socket adapter comprising:
a rear housing including a base adapted to receive the watthour meter and terminals connectable to electric line and load power conductors;
contacts disposed in the base adapted to be connected to the terminals and adapted to receive the watthour meter blade terminals;

a front housing attachable to the base and covering the contacts and the terminals while allowing the watthour meter blade terminals to be inserted into the contacts and allowing access to the terminals through the front housing;

a terminal cover mountable over the terminals;

a clip integrally formed on the front housing and extendable through an aperture in the terminal cover when the terminal cover is mounted on the joined front and rear housings, the clip adapted for receiving a terminal cover seal.

21. The watthour meter socket adapter of claim 20 further comprising:

an aperture formed in a portion of the clip extendable outward through the terminal cover when the terminal cover is mounted on the one of the front housing and the rear housing.

22. The watthour meter socket adapter of claim 21 further comprising:

a supplemental clip unitarily formed as an integral part of the front housing, the supplemental clip extendable through another aperture in the terminal cover when the terminal cover is mounted on the joined front and rear housings; and an aperture formed in an end portion of the clip disposed exteriorly of the terminal cover adapted for receiving a terminal cover seal.

23. A watthour meter socket adapter for use with a watthour meter having a plurality of blade terminals extending from a meter base, the watthour meter socket adapter comprising:

a housing including a base adapted to receive the watthour meter;

contacts disposed in the base adapted to receive the watthour meter blade terminals;

a hanger carried externally on the housing and adapted to be engaged with a socket adapter mounting surface;

a housing hanger fastener extending through the hanger into the housing; and a surge conductor removably mountable in the housing by the housing hanger fastener without requiring disengagement of the housing from a housing mounting surface.

24. The watthour meter socket adapter of claim 23 further comprising:

the housing including a front housing joined to a rear housing, the base being the rear housing; and the surge conductor mountable on the base of the rear housing exteriorly of the front housing.

25. The watthour meter socket adapter of claim 24 further comprising:

the front housing having an aperture for receiving the housing hanger fastener;

the fastener securing an end portion of the front housing and the rear housing together.

26. The watthour meter socket adapter of claim 25 further comprising:

the surge conductor securable to the hanger fastener exteriorly of the front housing to permit the surge conductor to be removable from the front housing without first separating the front housing from the rear housing.

27. A watthour meter socket adapter for use with a watthour meter socket adapter for use with a watthour meter having a plurality of blade terminals extending from a meter base, the watthour meter socket adapter comprising:

a housing including a base adapted to receive the watthour meter;

contacts disposed in the base adapted to receive the watthour meter blade terminals;

a hanger carried externally on the housing;

a housing hanger fastener extendable into engagement with the hanger through the housing and adapted to be engaged with a socket adapter mounting surface;

a surge conductor removably mountable in the housing by the hanger fastener, the surge conductor including a unitary, electrically conductive body including a boss with a bore adapted to receive the hanger fastener, a pair of arms extending from the boss, end pieces extending from outer portions of the arms and transitioning into legs mountable adjacent an inner surface of the housing, and a tab carried on the end of each leg adapted to be mounted in a position adapted to engage a ground contract on a watthour meter inserted into the housing.

28. A watthour meter socket adapter for use with a watthour meter having a plurality of blade terminals extending from a meter base, the watthour meter socket adapter comprising:

a housing including a base adapted to receive the watthour meter and terminals connectable to electric line and load power conductors;

contacts disposed in the base adapted to receive the watthour meter blade terminals; and a terminal cover mountable over the terminals and attachable to the housing, the terminal cover having a wall extending from an upper end, the wall and the upper end defining a cavity adjacent to the terminals, the terminal cover enclosing substantially all exterior portions of the terminals.

29. The watthour meter socket adapter of claim 28 wherein the terminal cover further comprises:

a front wall, a pair of spaced sidewalls joined at one end to the front wall and projecting away from the front wall, a bottom wall extending between the sidewalls substantially between the front wall and opposed ends of to the sidewalls closing one surface of the terminal cover, the front wall, the sidewalls and the bottom wall of the terminal cover enclosing end portions of conductors connected to the terminals.

30. The watthour meter socket adapter of claim 29 further comprising openable apertures carried in the bottom wall allowing the conductors to pass through to a connection to one of the terminals.

31. The watthour meter socket adapter of claim 30 wherein:

the openable apertures are spaced apart along the bottom wall by portions of the bottom wall.

32. A watthour meter socket adapter for use with a watthour meter having a plurality of blade terminals extending from a meter base, the watthour meter socket adapter comprising:

a front housing joined to a rear housing including a base adapted to receive the watthour meter and terminals connectable to electric line and load power conductors;

contacts disposed in the base adapted to receive the watthour meter blade terminals;

a ring lock clip having a band and a lock mechanism carried on the band releasably locking the band about a watthour meter and a sidewall of rear housing; and a projection carried on and extending from one of the front housing and the rear housing;

the projection engageable with the lock mechanism when the lock mechanism locks the band about the joined front housing and rear housing of the watthour meter socket adapter and a watthour meter.

33. The watthour meter socket adapter of claim 32 wherein:
the housing includes a front housing joined to a rear housing; and
the projection is carried on the front housing.

34. The watthour meter socket adapter of claim 33 further comprising:
the front housing attachable to the base and covering the contacts and the terminals while allowing the watthour meter blade terminals to be inserted into the contacts and allowing access to the terminals through the front housing.

35. The watthour meter socket adapter of claim 34 wherein:
the projection extends through a terminal cover mountable over the front housing.

36. A watthour meter socket adapter for use with a watthour meter having a plurality of blade terminals extending from a meter base, the watthour meter socket adapter comprising:
a housing including a base adapted to receive the watthour meter;
contacts disposed in the base adapted to receive the watthour meter blade terminals; and
at least one open ended attachment aperture formed in the housing adapted to engage a fastener mountable on a socket adapter mounting surface, the housing mountable over the fastener after the fastener is mounted in the socket adapter mounting surface.

37. The watthour meter socket adapter of claim 36 wherein:
the at least one aperture is open ended slot.

38. The watthour meter socket adapter of claim 36 further comprising:
at least one hook member carried on the housing engageable with the fastener to resist movement of the housing relative to the socket adapter mounting surface.

39. A method of installing a watthour meter socket adapter in a watthour meter socket having a socket adapter mounting surface comprising the steps of:
joining a socket adapter rear housing carrying contacts engageable with watthour meter blade terminals with a socket adapter front housing covering the contacts while allowing the watthour meter blade terminals to pass through the front housing into engagement with the contacts;
securing at least one watthour meter socket adapter mounting fastener in a socket mounting surface, the mounting fastener having a shank with an enlarged head at one end spaced from the socket mounting surface; and
providing an open ended slot in the front housing slidable over the shank of the mounting fastener adjacent to the head of the fastener to mount the joined front housing and rear housing of the socket adapter on the socket mounting surface.

40. The method of claim 39 further comprising the step of:
providing a hook in the front housing positioned to capture the head of the mounting fastener to resist movement of the front housing relative to the rear housing when a watthour meter is being disengaged from the contacts in the rear housing.

\* \* \* \* \*